(12) United States Patent
Noda

(10) Patent No.: US 7,127,665 B2
(45) Date of Patent: Oct. 24, 2006

(54) TRELLIS CODE DETECTOR AND DECODER

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 430 days.

(21) Appl. No.: 10/433,313

(22) PCT Filed: Oct. 2, 2002

(86) PCT No.: PCT/JP02/10248

§ 371 (c)(1),
(2), (4) Date: Jun. 2, 2003

(87) PCT Pub. No.: WO03/032313

PCT Pub. Date: Apr. 17, 2003

(65) Prior Publication Data

US 2004/0243914 A1    Dec. 2, 2004

(30) Foreign Application Priority Data

Oct. 3, 2001    (JP) .............................. 2001-307158

(51) Int. Cl.
*H04L 25/497* (2006.01)
(52) U.S. Cl. .................................................. 714/792
(58) Field of Classification Search ........ 714/786–788, 714/792; *H04L 25/497*
See application file for complete search history.

(56) References Cited

U.S. PATENT DOCUMENTS

| 4,571,734 | A | * | 2/1986 | Dolivo et al. ................ 375/291 |
| 5,539,588 | A | * | 7/1996 | Sawaguchi et al. ........... 360/46 |
| 5,550,683 | A | * | 8/1996 | Koren ........................ 360/46 |
| 6,028,728 | A | * | 2/2000 | Reed ........................... 360/51 |
| 6,347,390 | B1 | | 2/2002 | Ino ............................. 714/792 |
| 6,480,983 | B1 | * | 11/2002 | Noda ......................... 714/792 |
| 6,901,107 | B1 | * | 5/2005 | Dholakia et al. ........... 375/222 |
| 2002/0133782 | A1 | * | 9/2002 | Noda ......................... 714/792 |

FOREIGN PATENT DOCUMENTS

| EP | 333324 A2 | * | 9/1989 |
| EP | 1 081 865 | | 3/2001 |
| JP | 63164643 A | * | 7/1988 |
| JP | 6-243598 | | 9/1994 |
| JP | 07211008 A | * | 8/1995 |

(Continued)

OTHER PUBLICATIONS

Noda, M.; A High-Rate Matched Spectral Null Code; IEEE Transactions On Magnetics, vol. 34, No. 4, Jul. 1998; pp. 1946-1948.*

(Continued)

*Primary Examiner*—R. Stephen Dildine
(74) *Attorney, Agent, or Firm*—Finnegan, Henderson, Farabow, Garrett & Dunner, L.L.P.

(57) ABSTRACT

The present invention is to reduce the maximum magnetization reversal interval of a trellis code. A trellis diagram for the trellis code takes into consideration a constraint condition on the DSV of a code and an inter-symbol-interference for three bits. The minimum squared Euclidean distance is 4. When a non-interleaving encoder and a non-de-interleaving code detector are constructed using the trellis diagram, the maximum magnetization reversal interval of a trellis code to be used is reduced to half of that in a known case while having the error rate and circuit size approximately equal to those in the known case. The trellis diagram has a basic repeating unit for two bits. In the actual apparatus, the trellis diagram is repeatedly used. The present invention is applicable to a read/write apparatus.

14 Claims, 16 Drawing Sheets

FOREIGN PATENT DOCUMENTS

| | | |
|---|---|---|
| JP | 8-288850 | 11/1996 |
| JP | 11-186917 | 7/1999 |
| JP | 2000-40968 | 2/2000 |
| JP | 2001-77695 | 3/2001 |
| WO | WO 9620551 A1 * | 7/1996 |

OTHER PUBLICATIONS

R. Karabed and P. Siegel; Matched Spectral-Null Codes for Partial-Response Channels, IEEE Transactions on Information Theory, vol. 37, No. 3, May 1991, pp. 818-855.*

Forney, G.D., Jr.; Calderbank, A.R.; Coset codes for partial response channels; or, coset codes with spectral nulls; Information Theory, IEEE Transactions on; vol. 35, Issue 5, Sep. 1989 pp. 925-943.*

L. J. Fredrickson et al., "*Improved trellis-coding for partial-response channels*," IEEE Transactions on Magnetics, vol. 31, No. 2, pp. 141-1148, Mar. 1995.

L. J. Frederickson, "*On the Shannon capacity of the DC- and Nyquist-free codes*," IEEE Transactions on Information Theory, vol. 37, No. 3, pp. 918-923, May 1991.

E. R. Kretzmer, "*Generalization of a techniques for binary data transmission*," IEEE Transactions on Communication Technology, vol. COM-14, No. 1, pp. 67-68, Feb. 1966.

J.W. Rae et al., *Design and performance of a VLSI 120 Mb/s trellis-coded partial response channel*, IEEE Transactions on Magnetics, vol. 31, No. 2, pp. 1208-1214, Mar. 1995.

* cited by examiner

TRELLIS CODE DETECTOR AND DECODER

TECHNICAL FIELD

The present invention relates to trellis code detectors and decoding apparatuses, and, for example, relates to a trellis code detector and decoding apparatus capable of greatly reducing the maximum run-length of a code for use in detecting a trellis code that is used to reduce the error rate of a digital transmission signal in magnetic read/write apparatuses including digital video cassette recorders or hard disk drives for computers and the like, various read/write apparatuses including magneto-optical read/write apparatuses such as magneto-optical disk drives, and various communications apparatuses.

BACKGROUND ART

In various recent read/write apparatuses and communications apparatuses, research and development has been actively conducted on trellis coded modulation (TCM), which is one effective means for reducing the code error rate of digital transmission signals. TCM is a scheme that combines convolutional coding or block coding, both of which take into consideration the characteristics of channels, with decoding such as Viterbi decoding using a trellis diagram based on a state transition diagram of a code. A coding rule is used by a code detector to calculate the likelihood. By increasing the minimum Euclidean distance dmin between trellis code sequences used by the code detector, the error rate of digital transmission signals is reduced.

FIG. 1 is a block diagram of a digital signal processing circuit in a general read/write apparatus.

An encoder 1 encodes rate m:n input data where m represents the data bit length of unencoded data (prior to encoding) and n represents the data bit length of encoded data (subsequent to encoding). A D/A converter 2 converts the input write code from a digital signal into an analog signal, that is, a write rectangular wave. A read/write unit 3 includes a magnetic head, an optical pickup, a control circuit for controlling the driving of the magnetic head and the optical pickup, and the like. The read/write unit 3 writes the write wave input from the D/A converter 2 in a recording medium (not shown).

The read/write unit 3 reads a signal recorded in the recording medium and outputs an analog read wave to an analog equalizer 4. The analog equalizer 4 equalizes the read wave input from the read/write unit 3 to predetermined target equalization characteristics. An A/D converter 5 converts the input analog equalized wave into an equalized signal, that is, a digital read signal. Recently, maximum likelihood detectors are generally used to serve as a code detector 6. The code detector 6 converts the input digital read signal, that is, the equalized signal, into a code. In other words, the code detector 6 detects a code. A decoder 7 decodes the input detected code at a rate of n:m, generates output data, and outputs the output data.

The A/D converter 5 includes a phase locked loop (PLL). As the PLL, a hybrid digital PLL that only performs phase error detection by a digital unit or a full-digital PLL that performs both phase error detection and signal synchronization by a digital unit may be used.

When equalization by the analog equalizer 4 is insufficient, a digital equalizer may be provided between the A/D converter 5 and the code detector 6.

In code detection using TCM, a coding rule used by the encoder 1 is used by the code detector 6.

Recently, TCPR (trellis Coded Partial Response) that combines TCM and partial response equalization has been extensively discussed to serve as signal processing for magnetic read/write apparatuses. TCPR is a technique for increasing the free squared Euclidean distance by an encoding method and consequently improving the S/N (Signal/Noise: signal-to-noise ratio), whereby high-density recording is made possible. Hereinafter the free squared Euclidean distance may also be referred to as the free distance.

The free distance refers to the minimum Euclidean distance between two different paths, both of which originate in a common state and end in a common state on a trellis diagram representing an output sequence of a partial response channel. The trellis diagram is also referred to as a detection trellis. Viterbi detection is performed on the basis of the trellis diagram. The start state and the end state need not be the same.

One known type of trellis code for use in TCPR modulation is an MSN (Matched Spectral Null) code in which a null point of a code spectrum on the frequency axis matches a null point of a signal spectrum that has been partial-response-equalized by limiting a running digital sum (RDS) or an alternating digital sum (ADS) of a code sequence or both RDS and ADS to finite values.

The characteristics of the MSN code and a code detection method therefor are described in detail by, for example, R. Karabed and P. Siegel in "Matched Spectral-Null Codes for Partial-Response Channels," IEEE Trans. on Info. Theory, vol. 37, No. 3., PP. 818–815, May 1991.

RDS is computed by allocating +1 and −1 to symbols "1" and "0" of a code and computing the sum of symbols from the start point, that is, the initial point, of the code sequence. A code whose digital sum variation (DSV) of RDS is limited to a finite value has a spectral null at a DC component of the power spectrum of the code.

Such a code is known as an MSN code for a dicode channel having 1-D equalization characteristics wherein D is a delay element representing a one-bit delay on the frequency axis. A code whose DSV is limited to a finite value is not limited to the MSN code and is generally referred to as a DC free code. In this case, DSV is two or greater.

For example, the minimum squared Euclidean distance $d_{min}^2$ of a code detection trellis for the dicode channel is 2. By using a code detection trellis combining the DSV limitation rule and 1-D equalization characteristics, if 2<DVS, equation (1) holds true; if 2=DSV, equation (2) holds true:

$$d_{min}^2 = 4 \qquad (1)$$

$$d_{min}^2 = 6 \qquad (2)$$

When $d_{uncoded}$ represents the minimum Euclidean distance of unencoded data prior to encoding by the code detector 6, and $d_{coded}$ represents the minimum Euclidean distance of encoded data subsequent to encoding by the code detector 6, the gain of coding by the code detector 6, that is, the coding gain, is expressed by equation (3):

$$20 \log(d_{coded}/d_{uncoded}) \text{dB} \qquad (3)$$

In this case, if 2<DSV, the coding gain is 3 dB; if DSV=2, the coding gain is 6 dB.

Putting the 1-D equalization into practical use without modification is difficult because the 1-D equalization involves very large noise amplification in the high frequency band. In many cases, obtaining a satisfactory signal-to-noise ratio is difficult.

ADS involves, in NRZ modulation, allocation of +1 or 0 to each symbol in a code sequence, multiplication of every other bit by −1, NRZ modulation of the code sequence, and computation of the sum of all symbols from the start point. In NRZI modulation, NRZI modulation is performed on all inverted symbols, and the sum of all symbols from the start point is computed. A code whose A-DSV (Alternating Digital Sum Variation) of ADS is set to a finite range has a null at a Nyquist frequency component of the power spectrum of the code.

Such a code is known as an MSN code on a channel having equalization characteristics of $(1+D)^x$ (where x is a natural number). A code whose A-DSV is set to a finite range is not limited to the MSN code and is generally referred to as a Nyquist free code. In this case, A-DSV is two or greater.

$(1+D)^x$ equalization is known as being capable of achieving a satisfactory signal-to-noise ratio in read/write apparatuses since noise in the high frequency band of a read signal is suppressed. $(1+D)^x$ equalization in a case in which, for example, x=1, that is, 1+D equalization, is generally referred to as PR1 (Partial Response Class-I) equalization. PR1 equalization is put into practical use in, for example, magnetic read/write apparatuses for 3.8-mm streaming tapes and 8-mm streaming tapes.

Such partial response classification was done by Kretzmer. In general, partial response classification that complies with the contents of "Generation of a Technique for Binary Data Communication" by E. R. Kretzmer, IEEE Trans. on com. Tech., pp. 67–68, February 1996 is used.

For example, the minimum squared Euclidean distance $d^{min2}$ of a code detection trellis on a PR1 channel is 2. By using a code detection trellis combining A-DSV and PR1 equalization characteristics, if 2<A-DSV, equation (4) holds true; if A-DSV=2, equation (5) holds true:

$$d_{min}^2 = 4 \quad (4)$$

$$d_{min}^2 = 6 \quad (5)$$

$(1+d)^x$ equalization requires a DC component. When this equalization is used in a magnetic read/write apparatus that does not transmit a DC component, generally the DSV of a code must be limited to a finite value in order to prevent degradation of the signal-to-noise ratio of the system. Generally in an optical read/write apparatus that transmits a DC component, the DSV of a code must be similarly limited to a finite value in order to stabilize the PLL and to detect a servo signal.

Codes whose DSV and A-DSV are both limited to finite values have spectral nulls at DC and Nyquist frequency points. Such codes are not limited to MSN codes and are generally referred to as DC- and Nyquist-free codes. In other words, when using MSN codes, magnetic read/write apparatuses employing $(1+d)^x$ equalized channels use DC- and Nyquist-free codes.

PR1 MSN codes have already been put into practice by AIT2 (Advanced Intelligent Tape drive II) systems. AIT2 is the standard for 8-mm streaming tape magnetic read/write apparatuses.

DC- and Nyquist-free codes are known as MSN codes for channels with $(1-D)(1+D)^x$ equalization characteristics. Since $(1-D)(1+D)^x$ equalization suppresses noise in both the low-frequency band and the high-frequency band, including DC, of a read signal, such $(1-D)(1+D)^x$ equalization achieves a satisfactory signal-to-noise ratio in read/write apparatuses, and especially in magnetic read/write apparatuses that do not transmit DC components.

In $(1-D)(1+D)^x$ equalization, since x=1, that is, $(1-D)(1+D)$, $1-D^2$ equalization is generally referred to as PR4 (Partial Response Class-IV) equalization. The details of PR4 that has spectral nulls at both DC and Nyquist frequency points are described by Lyle J. Fredrickson in "On the Shannon Capacity of DC- and Nyquist-Free Code", IEEE Transactions on Information Theory, Vol. 37, No. 3, pp. 918–923, May 1991. PR4 has already been put into practice by hard disk drives, consumer digital VCRs (Video cassette recorders), and the like.

For example, the minimum squared Euclidean distance $d^{min2}$ of a code detection trellis on the PR4 channel is 2. Using a code detection trellis combining the DSV and A-DSV limitation rules and PR4 equalization characteristics, $d_{min}^2$ is 4 or 6, as in the case of the dicode channel.

When both the DSV and A-DSV limitation rules are reflected in the code detection trellis, the trellis detector becomes very complicated. Observation on an every-other-bit basis of a PR4 equalized signal having $1-D^2$ equalization characteristics gives 1−D equalization characteristics. Generally, a PR4 MSN code is easily constructed by interleaving a dicode channel MSN code on a bit-by-bit (bitwise) basis, assuming that the code is distinctively detected on a bit-by-bit basis.

When the dicode channel MSN code, which is a DC free code, is interleaved on a bit-by-bit basis, a write code is a DC- and Nyquist-free code in which both DSV and A-DSV are limited. In this case, null points of the code spectrum perfectly match null points of the PR4 equalization spectrum. The code is the PR4 MSN code.

In other words, the following method is generally used. When an MSN code is used on the PR4 channel, a dicode channel MSN code in which DSV is limited to a finite value is interleaved on a bit-by-bit basis, and a resulting code is recorded on a recording medium. When reading the code, the equalized signal is de-interlieaved on a bit-by-bit basis to detect the code.

As described above, although MSN codes obtain high coding gain, PR4 codes are difficult to put into practice in actual apparatuses.

One cause of this problem is that a known method employs a low coding rate of 4/5 and that the signal-to-noise ratio is greatly degraded in the case of a high linear recording density. Such a known method is thus inapplicable in practice. Recently, however, as disclosed in Japanese Unexamined Patent Application Publication No. 11-186917 submitted by the inventor of the present invention and in "High-Rate Matched Spectral Null code" by M. Noda, IEEE Trans. on Magn., vol. 34, No. 4, pp. 1946–1948, July 1998, this weakness is improved by technology concerning MSN codes having a high coding rate of 8/9.

Another cause of the problem of the PR4 MSN code being difficult to put into practice is that the maximum magnetization reversal interval Tmax is increased when the code is recorded. In the case of NRZI recording, the maximum magnetization reversal interval Tmax when the code is recorded is the maximum length of a continuous sequence of data 0 (the maximum run-length)+1. In the case of the PR4 MSN code, the maximum magnetization reversal interval Tmax is increased since two independent dicode channel MSN codes are interleaved on a bit-by-bit basis. In other words, the maximum magnetization reversal interval Tmax of an interleaved code (subsequent to interleaving) is twice as high as the maximum magnetization reversal interval Tmax of a non-interleaved code (prior to interleaving).

In the case of NRZI recording, the maximum magnetization reversal interval Tmax is the sum of the maximum length of a continuous sequence of data 0 (the maximum run-length) and 1. In the case of NRZ recording, the maximum magnetization reversal interval Tmax is equivalent to the maximum run-length.

For example, in magnetic reading apparatuses, a reduction in Tmax of a code has a great favorable influence on the reduction in overwrite noise of a read signal and on PLL stabilization. Specifically, when Tmax of a code is high, information for achieving PLL synchronization is reduced, which may cause a failure.

In the case of a high Tmax, azimuth recording generates a high cross-talk from neighboring tracks, which in turn degrades the quality of read data. As discussed above, a reduction in Tmax of a code is widely known to help improve the performance of read/write apparatuses.

In the read/write apparatuses, especially a helical-scan tape system using a rotary drum, a high-pass filter is formed by a winding inductance of a rotary transformer and a winding DC resistance of a write head. The low frequency components of a recording current waveform are cut off, and it is difficult to write a recording waveform signal with a high Tmax on a magnetic tape.

In general read/write apparatuses, Tmax of a code to be used is generally designed such that approximately $Tmax \leq 9T$ where T denotes the clock time interval. The above-described rate 8/9 dicode channel MSN code has a Tmax of 7T. In contrast, when this code is interleaved on a bit-by-bit basis, Tmax of the resultant code is twice as high, that is, 14T. In other words, since the two independent dicode channel MSN codes are interleaved on a bit-by-bit basis, Tmax becomes very high, which is inapplicable in practice.

DISCLOSURE OF INVENTION

In view of the foregoing circumstances, when using a trellis code detecting method for performing code detection using coding rules for likelihood calculation, it is an object of the present invention to perform PR4 equalization without interleaving a dicode MSN code on a bit-by-bit basis and to perform code detection using a trellis diagram including both a limitation rule of a DC component or a Nyquist component of a code spectrum and an inter-symbol-interference rule for three bits.

In view of the foregoing circumstances, when using a trellis code detecting method for performing code detection by using a coding rule for likelihood calculation, it is an object of the present invention to perform code detection by performing PR4 equalization of a dicode channel MSN code without interleaving the code on a bit-by-bit basis and using a trellis diagram including both a coding rule on a DC component or a Nyquist component of a code spectrum and an inter-symbol-interference rule for three bits.

A trellis code detector of the present invention includes a code detector for performing trellis code detection by applying a coding rule that there is a spectral null at one of a DC component and a Nyquist component of a code spectrum and a partial-response class-IV inter-symbol-interference rule.

The inter-symbol-interference rule may be an inter-symbol-interference rule for three bits.

The code detector may perform code detection using a trellis diagram to which the coding rule on the spectral null at the DC component and the inter-symbol-interference rule for three bits are applied.

The code may be a combination of codes in which the number of consecutive ones in a signal prior to Non Return to Zero Inverted (NRZI) modulation is limited to a finite value.

The code may be a combination of codes with a coding rate of 8/9 or greater.

The code may be a non-interleaved code sequence.

In the code, at least one of a digital sum variation (DSV) of a running digital sum (RDS) and a DSV of an alternating digital sum (ADS) of a code sequence may be limited to a predetermined value n (n is an integer greater than or equal to 2). In order to generate 2n or more transitional states, the code detector may includes ACS circuits, the number of which is the same as the number of states.

A trellis code detecting method of the present invention includes a code detecting step of performing trellis code detection by applying a coding rule that there is a spectral null at one of a DC component and a Nyquist component of a code spectrum and a partial-response class-IV inter-symbol-interference rule.

In the code detecting step, code detection may be performed using a trellis diagram to which the coding rule on the spectral null at the DC component and the inter-symbol-interference rule for three bits are applied.

The code may be a combination of codes in which the number of consecutive ones in a signal prior to Non Return to Zero Inverted (NRZI) modulation is limited to a finite value.

The code may be a combination of codes with a coding rate of 8/9 or greater.

The code may be a non-interleaved code sequence.

In the code, at least one of a digital sum variation (DSV) of a running digital sum (RDS) and a DSV of an alternating digital sum (ADS) of a code sequence may be limited to a predetermined value n (n is an integer greater than or equal to 2). In order to generate 2n or more transitional states, the code detecting step may include arithmetic steps, the number of which is the same as the number of states.

A program recorded in a first recording medium and a first program of the present invention includes a code detecting step of performing trellis code detection by applying a coding rule that there is a spectral null at one of a DC component and a Nyquist component of a code spectrum and a partial-response class-IV inter-symbol-interference rule.

A decoding apparatus of the present invention includes a code detector for performing trellis code detection by applying a coding rule that there is a spectral null at one of a DC component and a Nyquist component of a code spectrum and a partial-response class-IV inter-symbol-interference rule; and a decoder for decoding the code detected by the code detector.

A decoding method, a program recorded in a second recording medium, and a second program of the present invention includes a code detecting step of performing trellis code detection by applying a coding rule that there is a spectral null at one of a DC component and a Nyquist component of a code spectrum and a partial-response class-IV inter-symbol-interference rule; and a decoding step of decoding the code detected by the code detector.

According to a trellis detector, a trellis code detecting method, and a program of the present invention, a trellis code is detected by applying a coding rule that there is a spectral null at one of a DC component and a Nyquist component of a code spectrum and a partial-response class-IV inter-symbol-interference rule.

According to a decoding apparatus, a decoding method, and a program of the present invention, a trellis code is detected by applying a coding rule that there is a spectral null at one of a DC component and a Nyquist component of a code spectrum and a partial-response class-IV inter-symbol-interference rule, and the detected code is decoded.

BEST MODE FOR CARRYING OUT THE INVENTION

Hereinafter embodiments of the present invention will be described with reference to the drawings.

Figure 1:
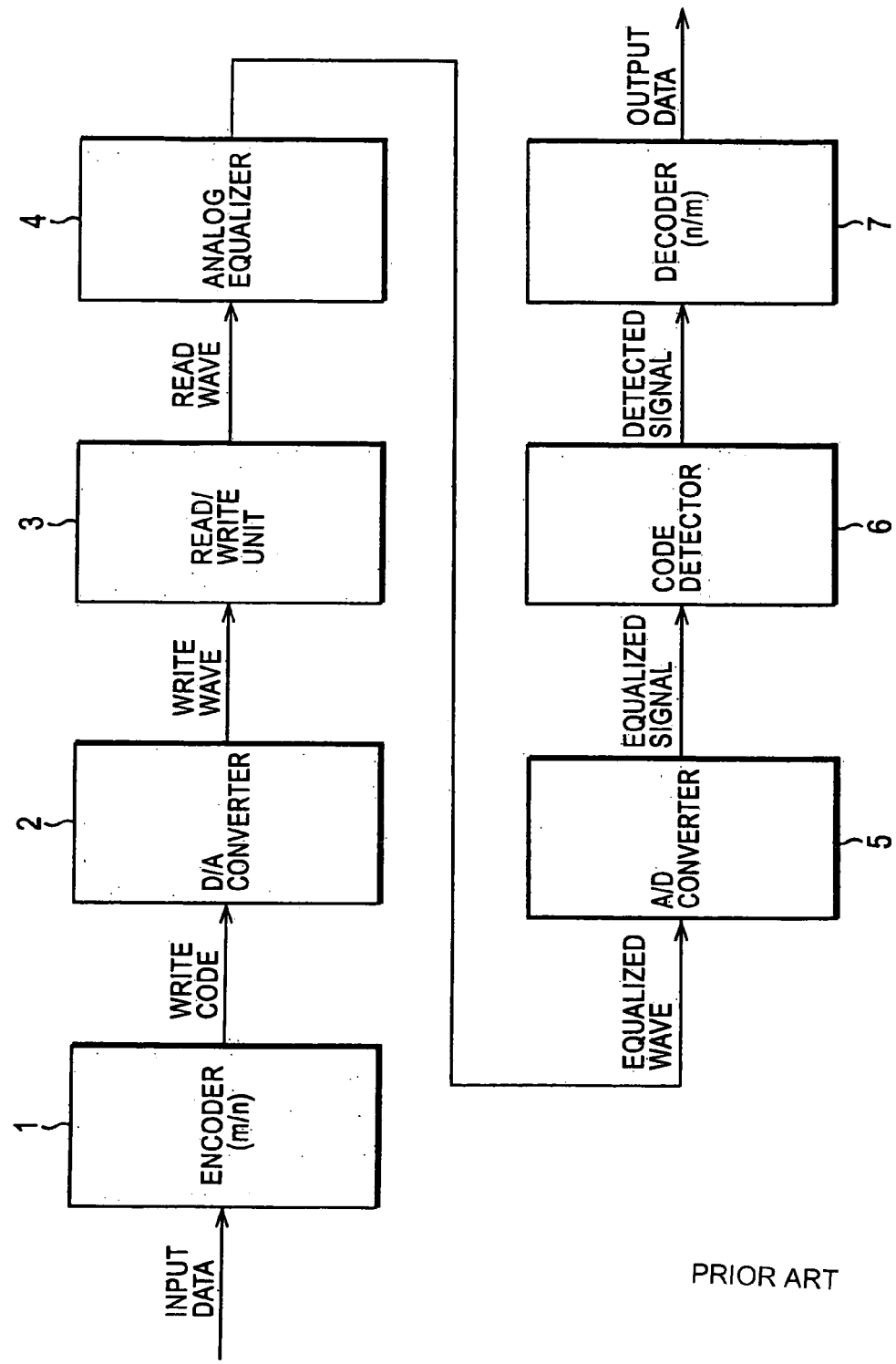
FIG. 1 is a block diagram showing the structure of a general read/write apparatus.
Figure 2:
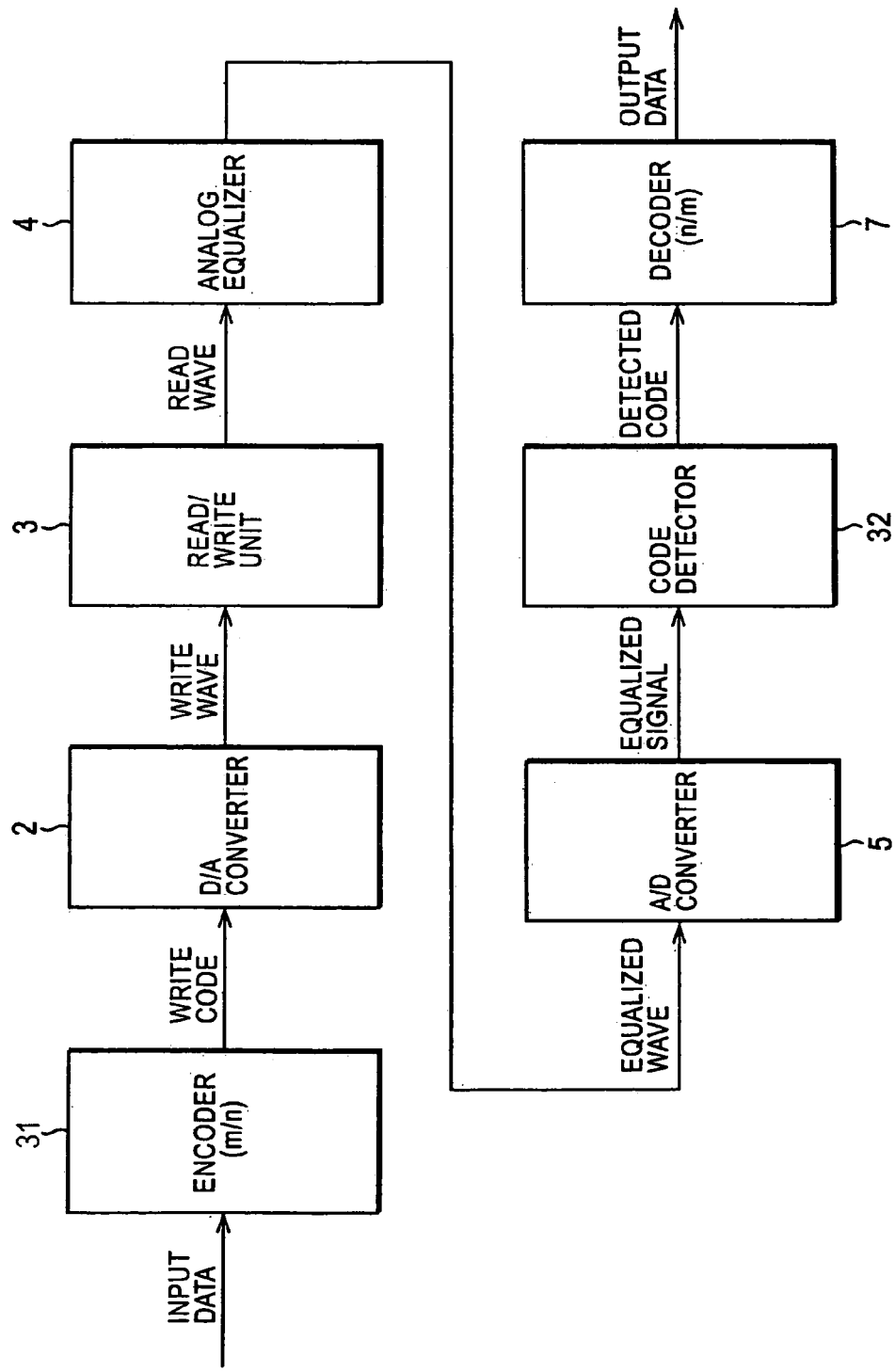
FIG. 2 is a block diagram showing the structure of a read/write apparatus according to the present invention.

FIG. 2 is a block diagram of a digital signal processing circuit according to the present invention. The same reference numerals are given to portions corresponding to those in a known case, and descriptions thereof are appropriately omitted (the same applies to the following description). Specifically, the read/write apparatus shown in FIG. 2 includes an encoder 31 in place of the encoder 1 and a code detector 32 in place of the code detector 6. Other than these, the read/write apparatus shown in FIG. 2 has a structure similar to that of FIG. 1.

Figure 3:
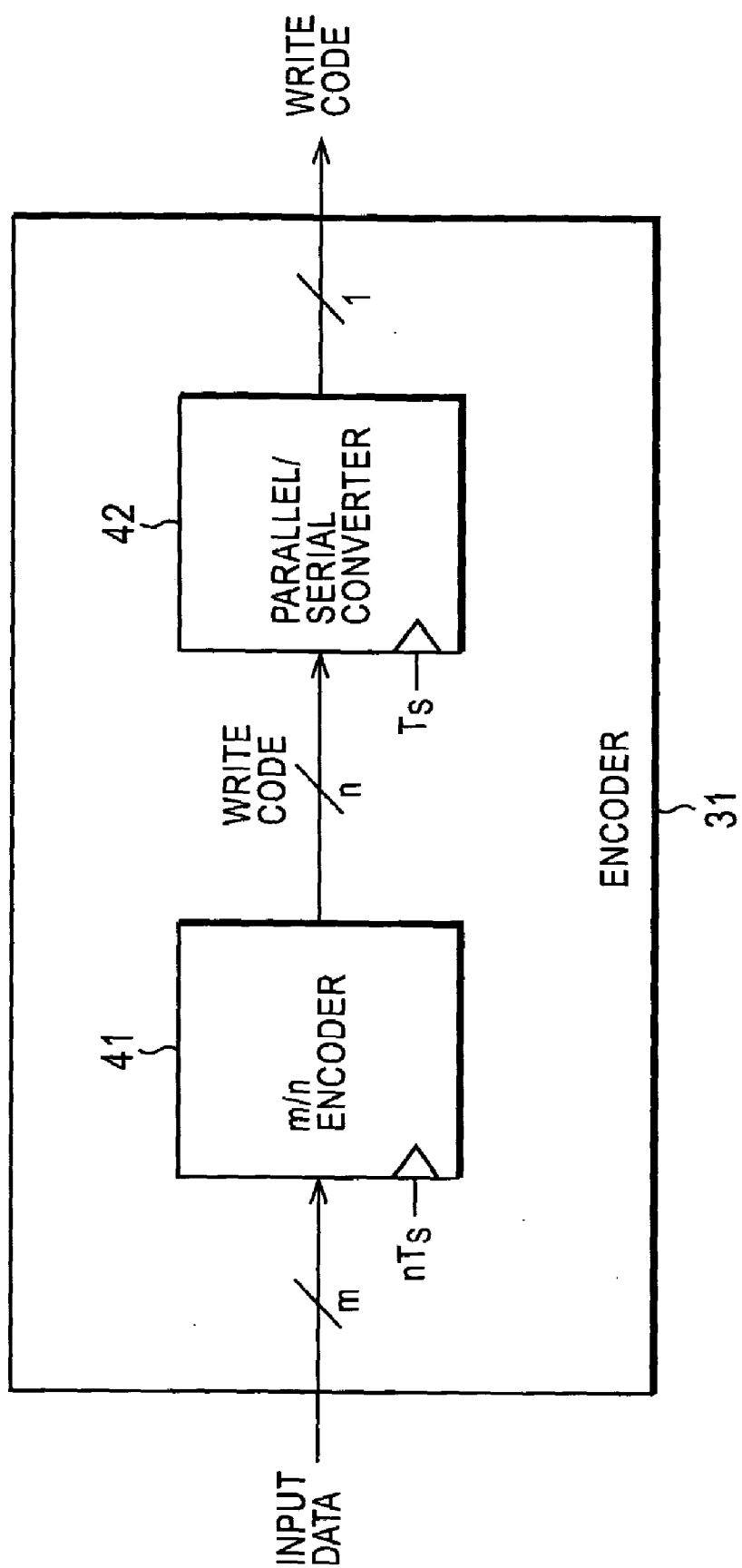
FIG. 3 is a block diagram showing the detailed structure of an encoder shown in FIG. 2.

FIG. 3 is a block diagram showing an example of the detailed structure of the encoder 31.

The encoder 31 is a non-interleaving type. An m/n encoder 41 converts m-bit input data into an n-bit write code at a time interval of nTs and inputs the n-bit write code to a parallel/serial converter 42, where Ts denotes a system clock time interval. The parallel/serial converter 42 converts the received write code into a 1-bit write code at a time interval of Ts and outputs the converted 1-bit write code to the A/D converter 2 shown in FIG. 2.

The structure of the encoder 31 described using FIG. 3 is a general non-interleaving encoding circuit used in modulation schemes other than known TCPR4 modulation. In other words, the read/write apparatus according to the present invention is characterized in that the encoder 31 having a structure similar to that of the non-interleaving encoding circuit is used to implement TCPR4 modulation. TCPR4 modulation refers to a modulation scheme combining trellis code modulation and an ISI rule (Inter-Symbol-Interference Rule) of $(1-D^2)$.

A write code output from the non-interleaving encoder 31 is converted by the D/A converter 2 into a write rectangular wave, as in the case described using FIG. 1, which in turn is recorded on a recording medium (not shown) by the read/write unit 3.

The signal recorded on the recording medium, which is read by the read/write unit 3, is equalized by the analog equalizer 4 to predetermined target equalization characteristics, as in the case described using FIG. 1. The equalized signal is converted by the A/D converter 5 into a digital equalized signal that is quantized into a bits, and the a-bit quantized digital equalized signal is output to the code detector 32.

Figure 4:
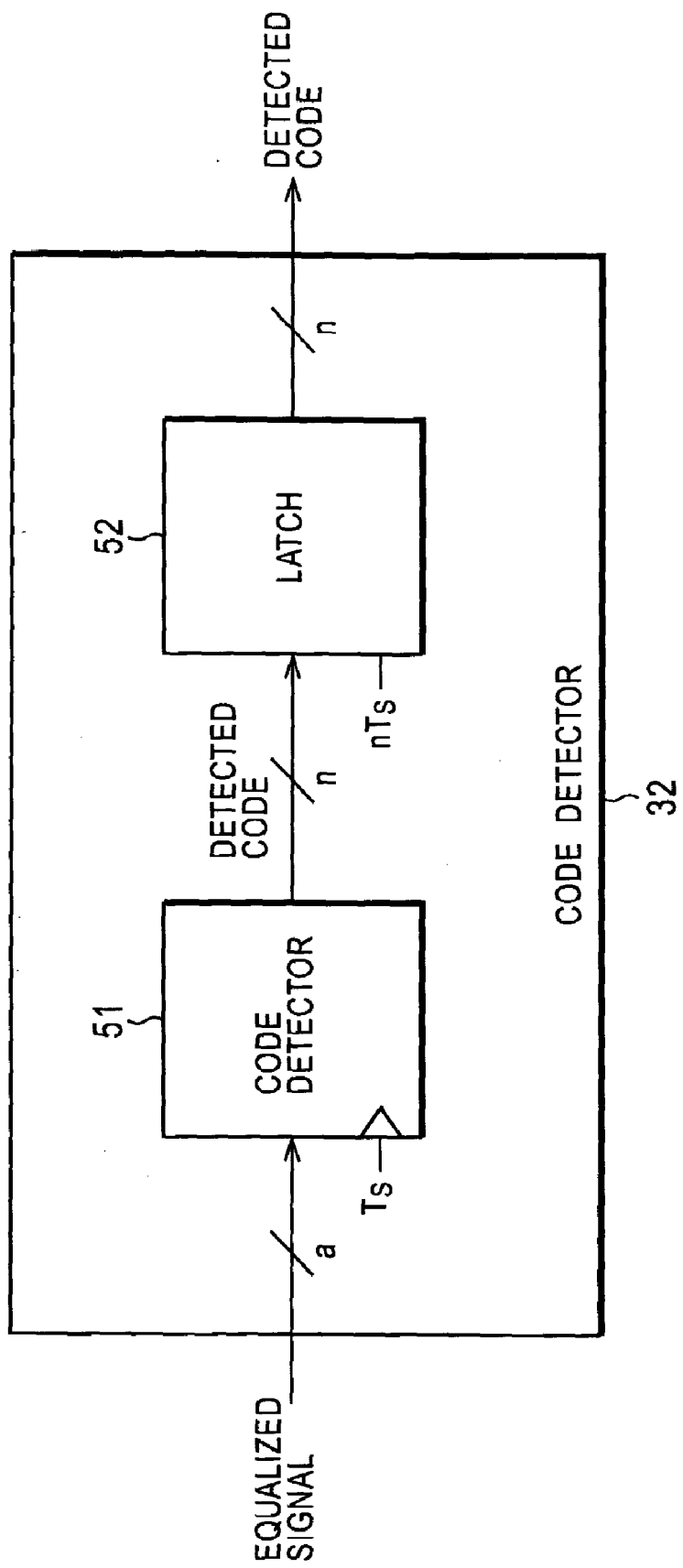
FIG. 4 is a block diagram showing the detailed structure of a code detector shown in FIG. 2.

FIG. 4 is a block diagram showing an example of the detailed structure of the code detector 32.

The code detector 32 is a non-de-interleaving type. The a-bit quantized equalized signal is converted by a code detector 51 into an n-bit code. In other words, a code is detected. The detected code is synchronized by a latch 52 and output to the decoder 7.

As shown in FIG. 4, the code detector 32 according to the present invention needs only one code detector 51. Such a structure is the structure of a general non-de-interleaving code detecting circuit used in modulation schemes other than known TCPR4 modulation. In other words, the read/write apparatus according to the present invention is characterized in that the code detector 32 having a structure similar to that of the non-de-interleaving code detecting circuit, which is used in modulation schemes other than known TCPR4 modulation, is used to implement TCPR4 modulation.

The detected code output from the code detector 32 is decoded at a rate of n:m by the decoder 7, as in the case described using FIG. 1, and the decoded code is output as output data.

Preferably, the DSV or A-DSV of the code used in the read/write apparatus described using FIGS. 2 to 4 can be any value, though it should be as small a value as possible in order to simplify the trellis code detector. Both NRZ (Non-return to zero) modulation and NRZI (Non Return to Zero Inverted (Non Return to Zero on one)) modulation are applicable to the read/write apparatus. In this description, a 24/27 conversion code for NRZI modulation with DSV=8 is used. In FIGS. 3 and 4, the value of n is 27 (n=27).

Figure 5:
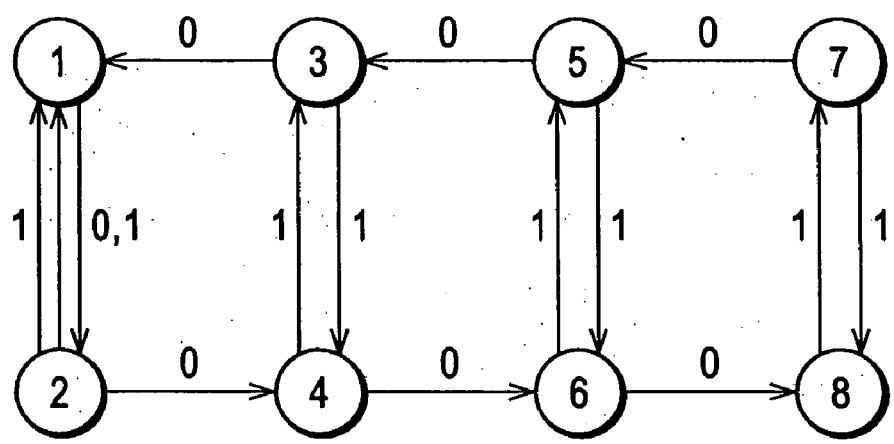
FIG. 5 is an illustration for describing an 8-state transition diagram used in the present invention.

FIG. 5 shows an 8-state transition diagram for code generation assuming NRZI modulation where the DSV of a code is limited to 8.

In the state transition diagram shown in FIG. 5, a 24/27 conversion code starting in state 2 or 3 and ending in state 4 or 5 and a 24/27 conversion code starting in state 4 or 5 and ending in state 2 or 3 are alternately used.

According to the state transition diagram, a sequence of the maximum number of 0 symbols is obtained when the state transits in the sequence 7, 5, 3, 1, 2, 4, 6, and 8, wherein Tmax is 7T.

This coding method eliminates a possible code sequence based on which an estimated code cannot be determined by maximum likelihood code detection, that is, QCS (Quasi-catastrophic sequence), and performs encoding/decoding by splitting a high coding rate 24/27 code into a 12/13 conversion code and a 12/14 conversion code. The circuitry of the encoder and decoder thus only requires a few thousand gates, which is a practical circuit size.

The details of the coding method are disclosed by the inventor of the present invention in Japanese Unexamined Patent Application Publication No. 11-186917 and by M. Noda in "High-Rate Matched Spectral Null code," IEEE Trans. on Magn., vol. 34, No. 4, pp. 1946–1948, July 1998. The technology disclosed in these documents employs a bitwise interleaved code. In contrast, the read/write apparatus according to the present invention employs, as described using FIG. 3, a non-interleaved code. Therefore, Tmax of the code is 7T.

Figure 6:
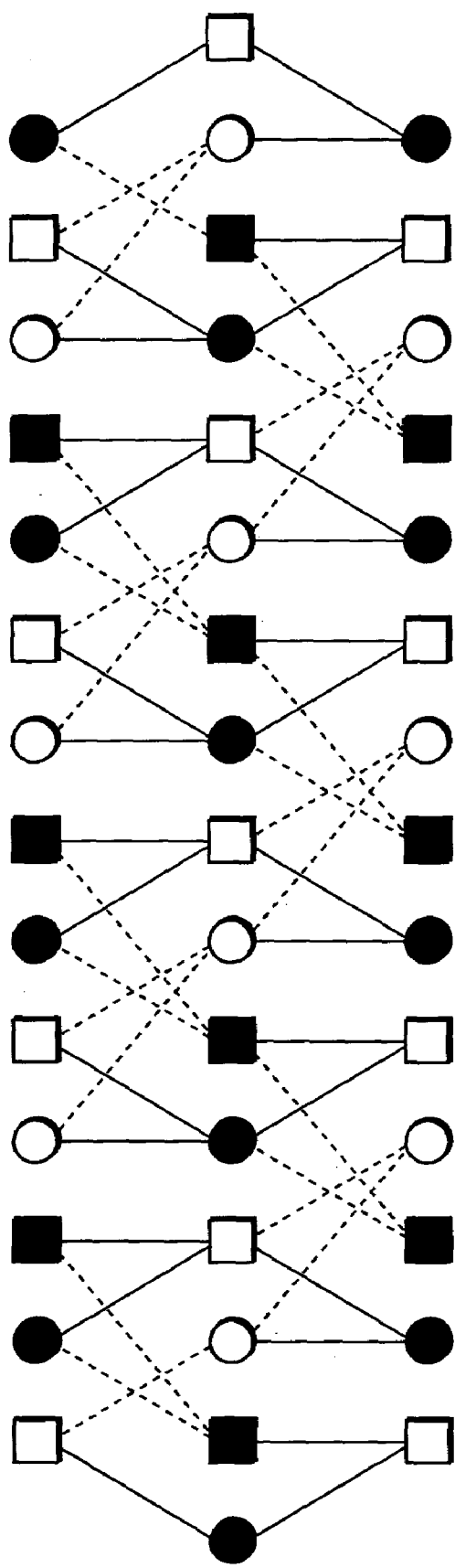
FIG. 6 is an illustration for describing a 16-state trellis diagram used in the present invention.

FIG. 6 is a 16-state trellis diagram for 2 periods of time (2T) based on a channel clock, which is used in the code detector 51 of the code detector 32 described using FIG. 4. Using the state transition diagram described with reference to FIG. 5, when a code for use is interleaved on a bit-by-bit basis, the trellis diagram has 8 states, which will be described below. In the read/write apparatus according to the present invention, no interleaving is performed. The trellis diagram thus has 16 states.

In FIG. 6, each state colored white or black denotes the positive or negative polarity of a write code after NRZI modulation. Each state denoted by a circle or a square denotes the positive or negative polarity of one previous bit of the write code after NRZI modulation. For one RDS value, a single state is allocated. The solid or dotted line output from each state denotes that the code before NRZI modulation is 1 or 0.

The trellis diagram shown in FIG. 6 takes into consideration a limitation rule of the DSV of the code and inter-symbol-interference for three bits. The minimum squared Euclidean distance is 4. The trellis diagram has a basic repeating unit per 2T. In the actual apparatus, the trellis diagram is repeatedly used.

In FIG. 6, QCS is not eliminated. In actual use, part of the states of the trellis diagram is eliminated in accordance with the above-described code state transition rule, depending on the detection time. Accordingly, QCS is eliminated.

Figure 7:
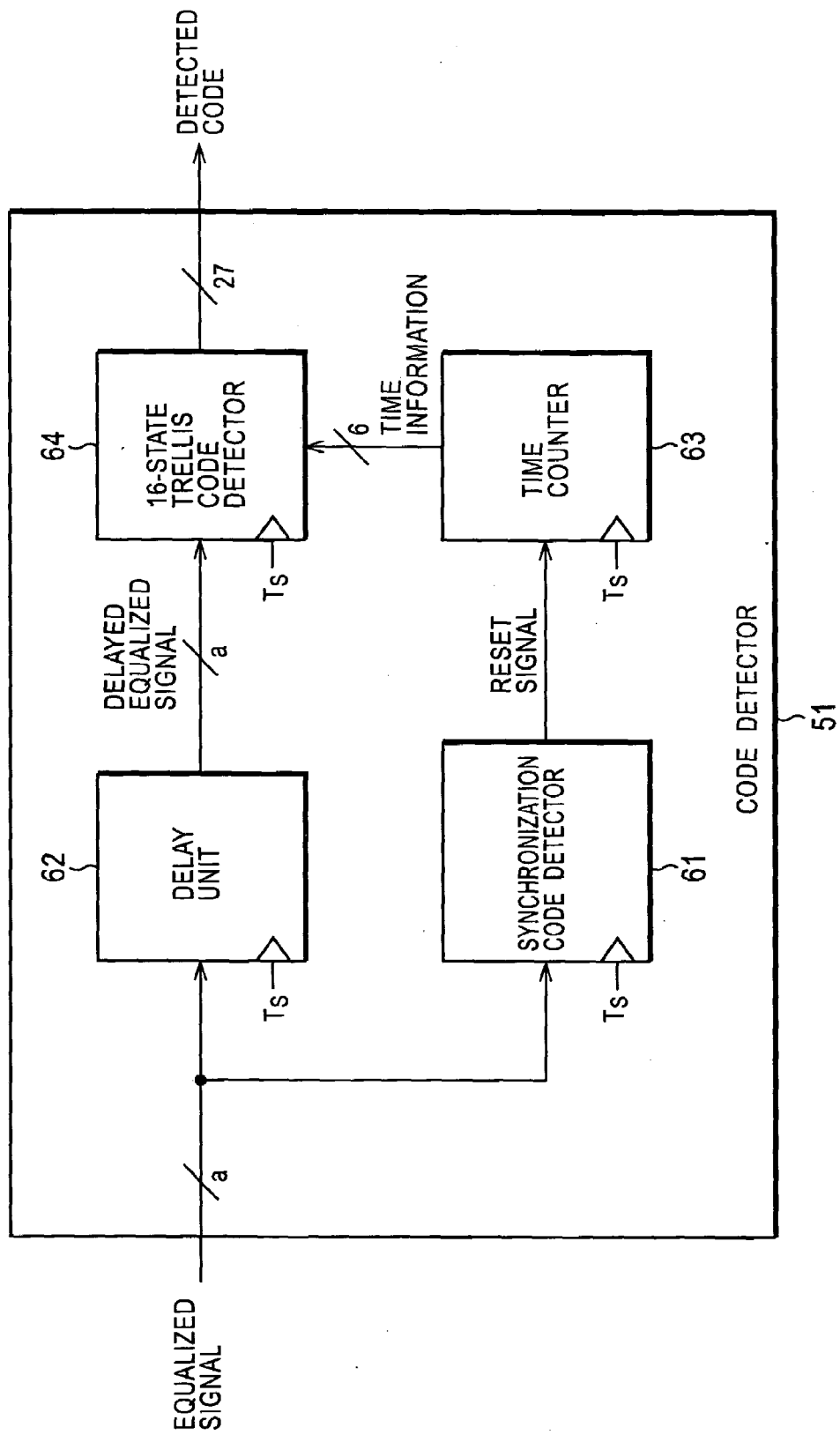
FIG. 7 is a block diagram showing the detailed structure of the code detector shown in FIG. 4.

FIG. 7 is a block diagram showing an example of the detailed structure of the code detector 51 of the code detector 32 described using FIG. 4, which is designed to detect a code when the 24/27 conversion code for NRZI modulation with DSV=8 is used, that is, when the 16-state trellis diagram described with reference to FIG. 6 is used.

The a-bit quantized equalized signal is separated into two lines, which are input to a synchronization code detector 61 and a delay unit 62. The synchronization code detector 61 performs code detection using a general Viterbi detecting method involving obtaining a path with the minimum metric and performing maximum likelihood decoding in every state at each point in the trellis diagram and outputs to a time counter 63 a 1-bit reset signal indicating whether or not a synchronization code is detected.

The time counter 63 outputs 1 to 54 6-bit time information, which is reset in accordance with the reset signal input from the synchronization code detector 61, to a 16-state trellis code detector 64. The time counter 63 counts up to 54, which is two times 27, i.e., the number of bits after coding, because the code has been converted differently on a bit-by-bit basis, as described above.

The delay unit 62 receives the a-bit quantized equalized signal input and delays the equalized signal so that the phase of the equalized signal matches that of the reset signal output from the synchronization code detector 61. The delay unit 62 outputs a delayed a-bit equalized signal to the 16-state trellis code detector 64.

Figure 8:
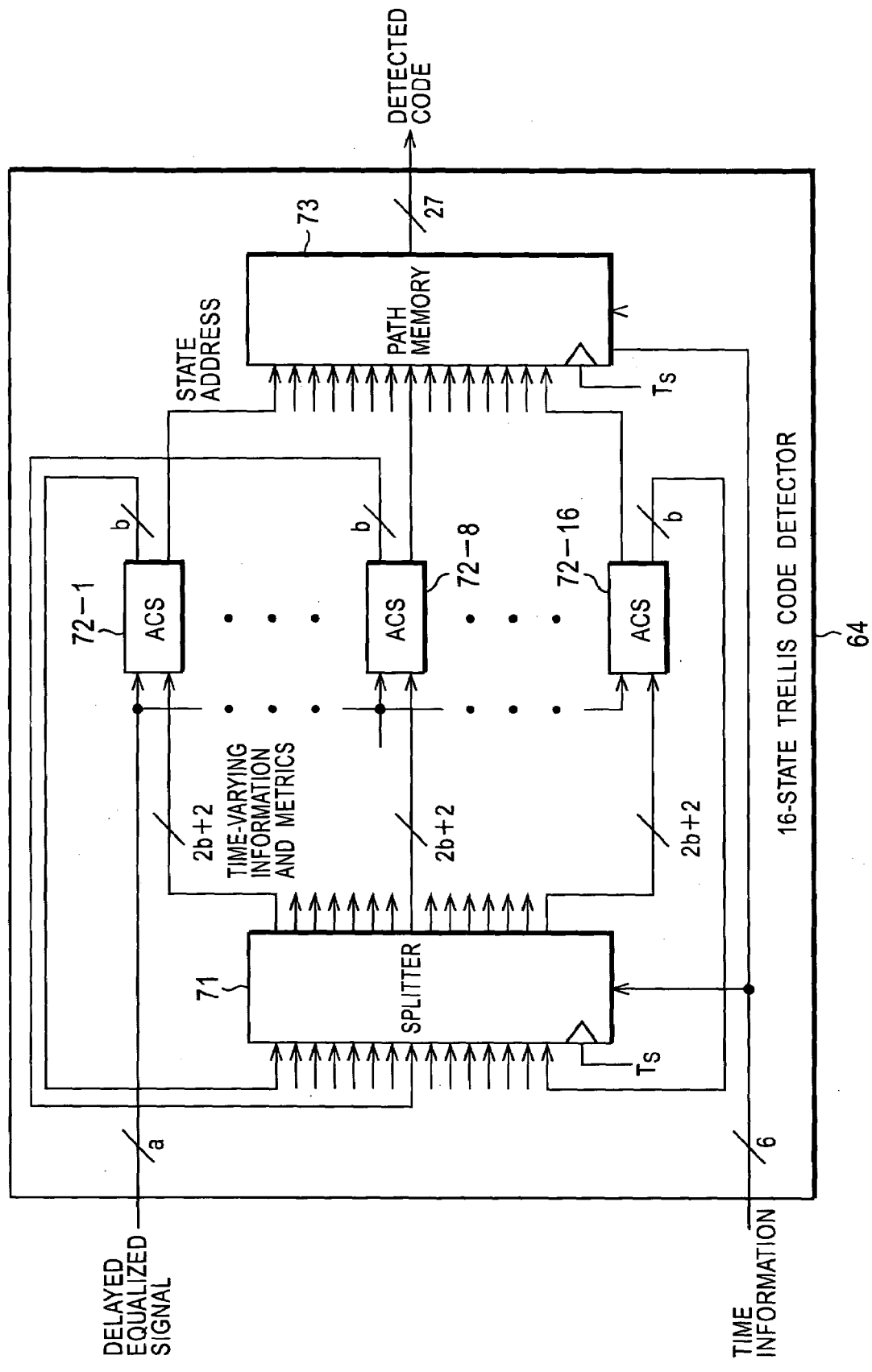
FIG. 8 is a block diagram showing the detailed structure of a 16-state trellis code detector shown in FIG. 7.

The 16-state trellis code detector 64 receives the delayed equalized signal and the time information, performs code detection, and outputs a 27-bit detected code. FIG. 8 is a block diagram showing an example of the detailed structure of the 16-state trellis code detector 64.

The 6-bit time information input from the time counter 63 is input to a splitter 71 and a bus memory 73. The delayed a-bit equalized information input from the delay unit 62 is input to ACS (add, compare, and select) circuits 72-1 to 72-16.

Alternatively, branch metrics for metric calculation are calculated in advance, and the branch metrics are input to the ACS circuits 72-1 to 72-16.

On the basis of the input time information and the 16-state trellis diagram described using FIG. 6, the splitter 71 generates 16 types of 2-bit time-varying information indicating whether or not each path of two metrics input to each of the ACS circuits 72-1 to 72-16 is broken, selects two appropriate metrics from among 16 previous time metrics that are quantized into b bits for each of the ACS circuits 72-1 to 72-16, and outputs the selected metrics to the ACS circuits 72-1 to 72-16. In other words, the splitter 71 outputs a total of 16×(2b+2)-bit information.

The ACS circuits 72-1 to 72-16 all have the same circuit configuration. By performing the arithmetic processing for addition, comparison, and selection, each of the ACS circuits 72-1 to 72-16 feeds back the current time metric to the splitter 71 and outputs a 1-bit state address indicating a surviving path to the bus memory 73.

The bus memory 73 that has received the input of the 1-bit state addresses selects the correct path on the basis of the address information, the 6-bit time information input from the time counter 63, and the 16-state trellis diagram described using FIG. 6 and outputs a 27-bit detected code with the maximum likelihood.

As described above, in the read/write apparatus described using FIGS. 2 to 8, TCPR4 modulation is realized using the 16-state trellis diagram shown in FIG. 6 and applying non-interleaving and non-de-interleaving. Therefore, Tmax is not increased.

Figure 9:
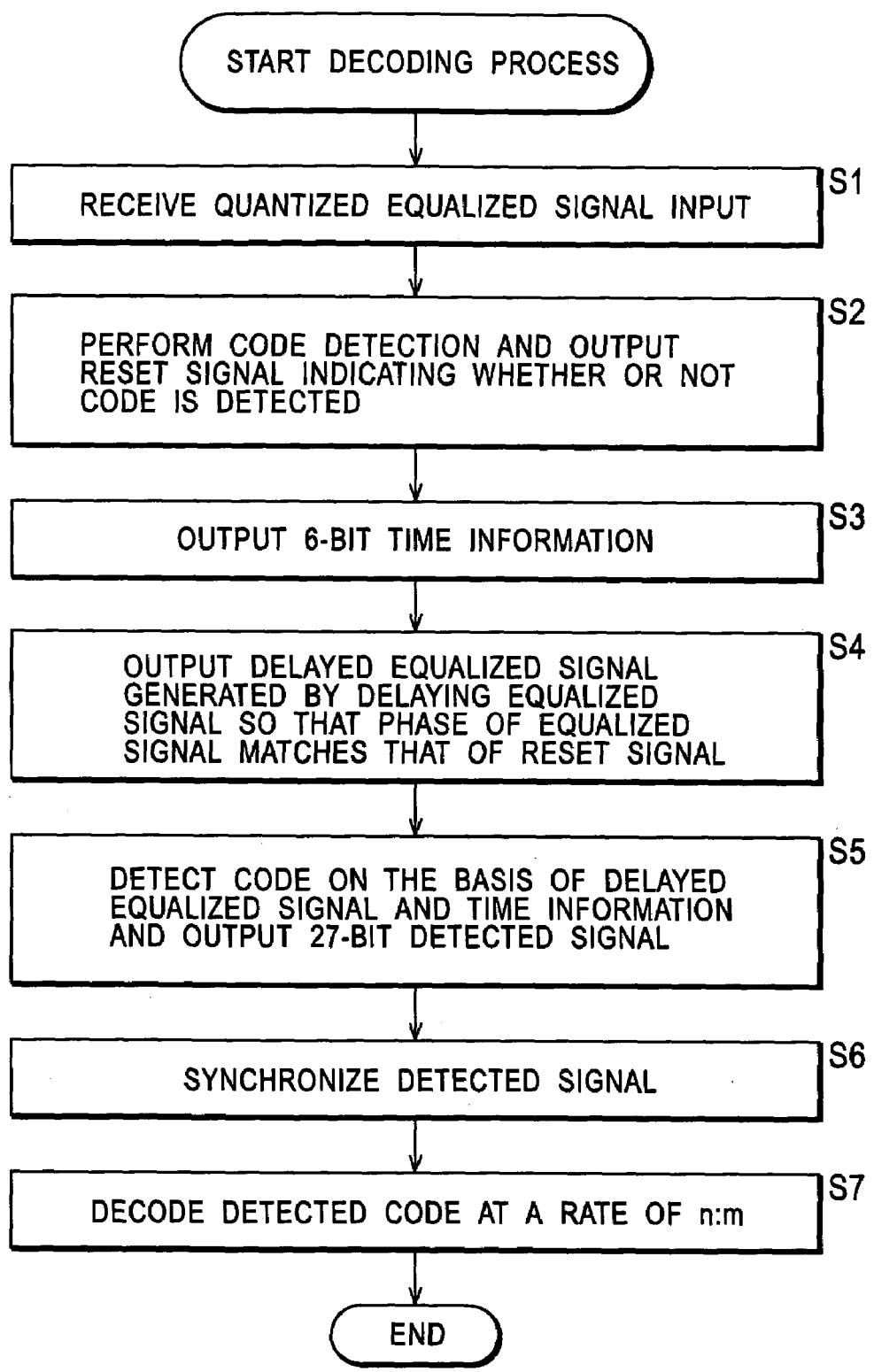
FIG. 9 is a flowchart showing a decoding process.

With reference to the flowchart of FIG. 9, a decoding process will now be described.

In step S1, the synchronization code detector 61 and the delay unit 62 receive an input equalized signal that has been quantized into a bits.

In step S2, the synchronization code detector 61 performs code detection using a general Viterbi detecting method that involves obtaining a path with the minimum metric and performing maximum likelihood decoding in every state at each point in the trellis diagram and outputs to the time counter 63 a 1-bit reset signal indicating whether or not a synchronization code is detected.

In step S3, the time counter 63 outputs 1 to 54 6-bit time information, which is reset in accordance with the reset signal input from the synchronization code detector 61, to the 16-state trellis code detector 64. The time counter 63 outputs 1 to 54 6-bit time information, which is reset in accordance with the reset signal input from the synchronization code detector 61, to the 16-state trellis code detector 64. The time counter 63 counts up to 54, which is two times 27, i.e., the number of bits after coding, because the code has been converted differently on a bit-by-bit basis.

In step S4, the delay unit 62 receives the a-bit quantized equalized signal, which is input in step S1, and delays the equalized signal so that the phase of the equalized signal matches that of the reset signal output from the synchronization code detector 61. The delay unit 62 outputs a delayed a-bit equalized signal to the 16-state trellis code detector 64.

In step S5, the 16-state trellis code detector 64 receives the delayed equalized signal and the time information, as described using FIG. 8, performs code detection, and outputs a 27-bit detected code to the latch 52.

In step S6, the latch 52 synchronizes the input detected code and outputs the synchronized code to the decoder 7.

In step S7, the decoder 7 decodes the input detected code at a rate of n:m and generates and outputs output data. The process is thus completed.

Using FIGS. 2 to 9, the TCPR4 non-interleaving and non-de-interleaving read/write apparatus according to the present invention has been described. As a comparative example, a TCPR4 interleaving and de-interleaving read/write apparatus will now be described.

Figure 10:
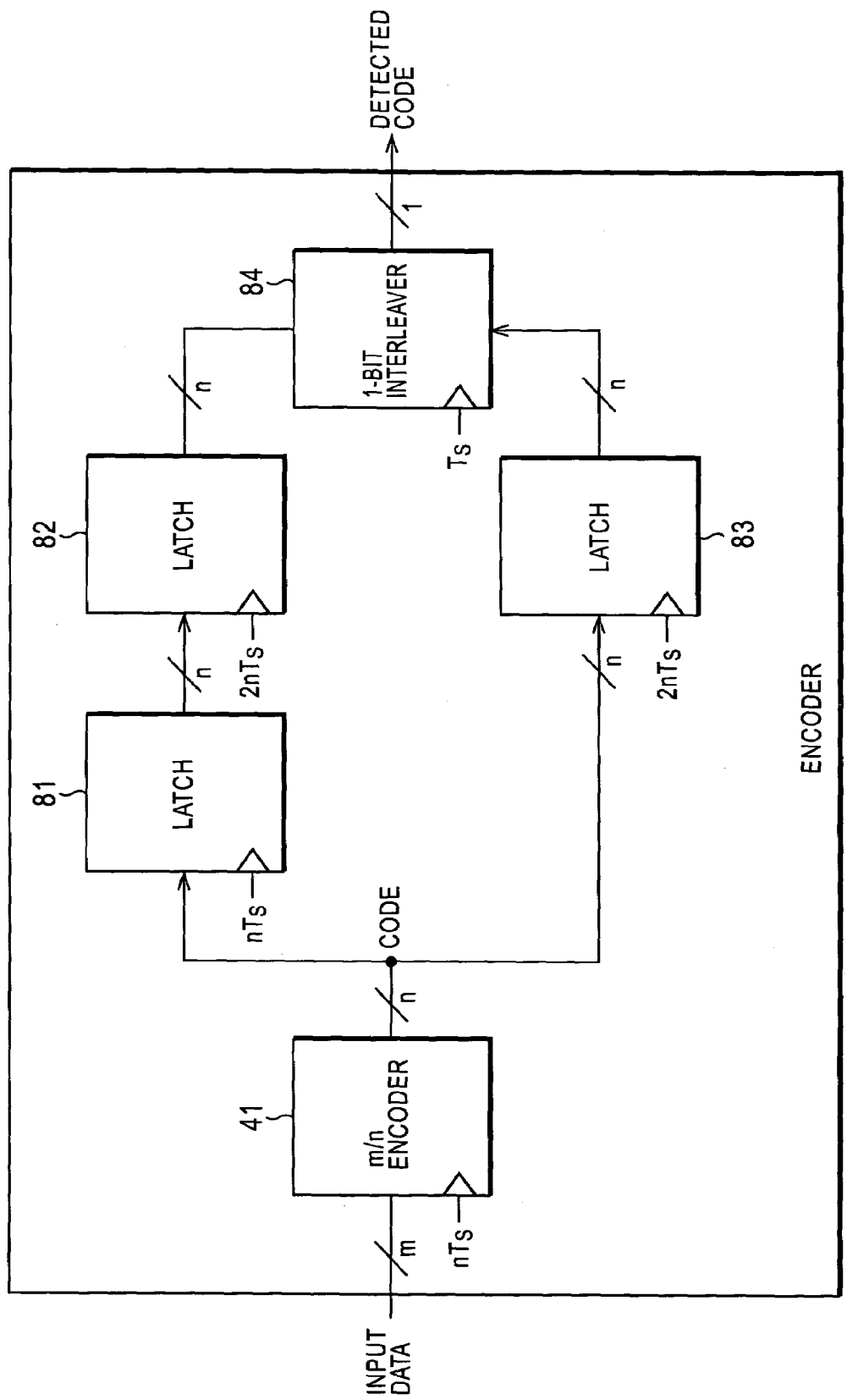
FIG. 10 is a block diagram showing the structure of an interleaving encoder according to a comparative example.

FIG. 10 is a block diagram showing an example of the structure of an interleaving encoder used in the comparative example in place of the encoder 31 described using FIG. 3.

Input data of m bits is input to the m/n encoder 41 and converted into an n-bit write code at a time interval of nTs. The n-bit code output from the m/n encoder 41 is separated into two lines. One line is delayed by a latch 81 at a time interval of nTs, which in turn is delayed by a latch 82 at a time interval of 2nTs and output to a 1-bit interleaver 84. The other line is delayed by a latch 83 at a time interval of 2nTs and output to the 1-bit interleaver 84.

The two lines of n-bit code are input to the 1-bit interleaver 84 and interleaved on a bit-by-bit basis, which in turn is output to the D/A converter 2 described using FIG. 1.

The encoder with the structure described using FIG. 10 is a generally used encoder when TCPR4 modulation is employed. In other words, in a known read/write apparatus described using FIG. 1, the encoder 1 used when TCPR4 modulation is employed has the structure described using FIG. 10. The details of the encoder 1 are disclosed in, for example, an article by J. W. Rae, et al., IEEE Trans. on Magn., vol. 31, No. 2, pp. 1208–1214, March 1995.

Figure 11:
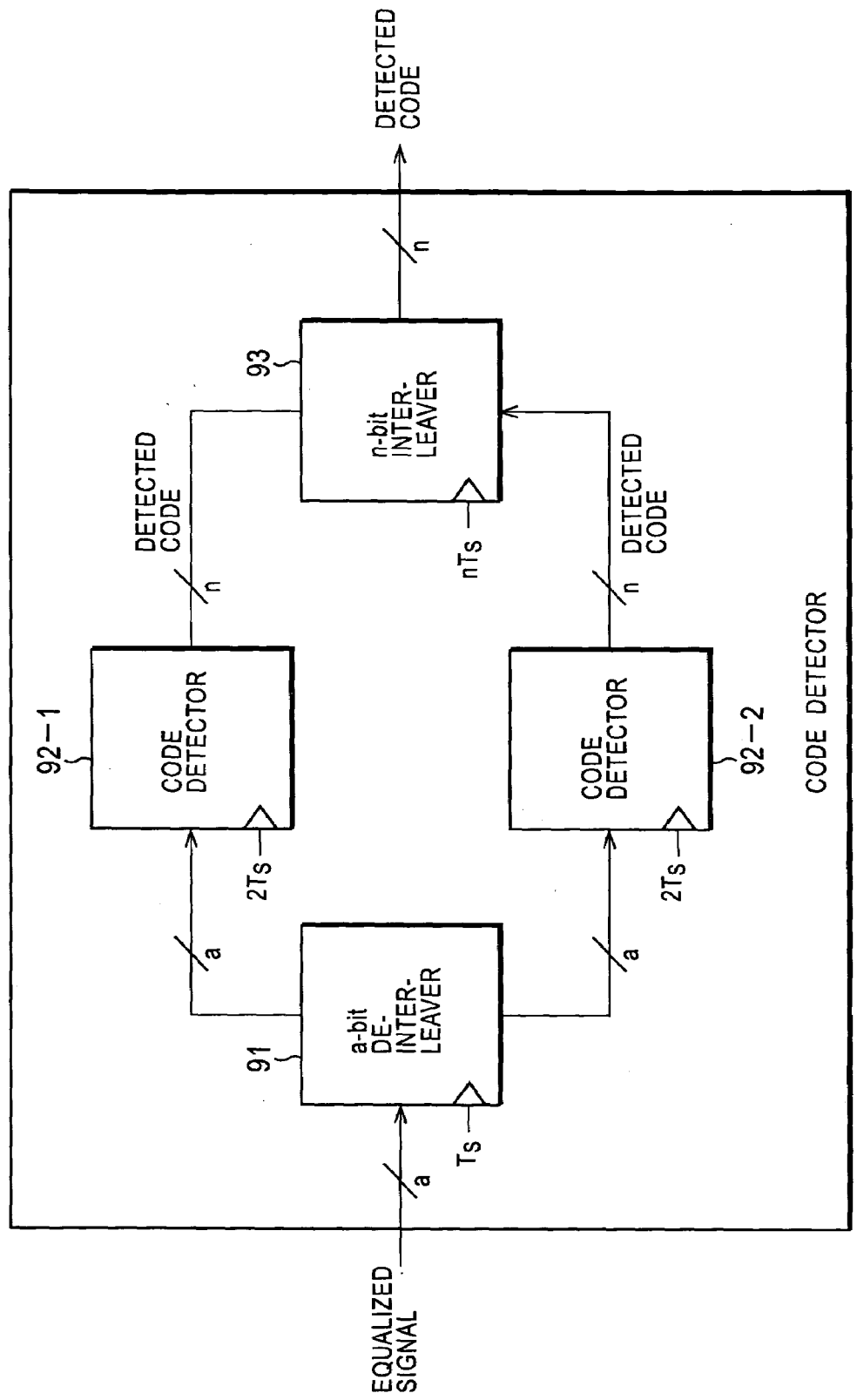
FIG. 11 is a block diagram showing the structure of a de-interleaving code detector according to the comparative example.

FIG. 11 is a block diagram showing an example of the structure of a code detector used in the comparative example in place of the code detector 32 described using FIG. 4.

An input a-bit equalized signal is input to an a-bit de-interleaver 91 and de-interleaved into two lines. One of the two lines is input to a code detector 92-1, and the other is input to a code detector 92-2, both of which are subjected to code detection at a time interval of 2nTs. The n-bit detected codes detected by the code detector 92-1 and the code detector 92-2 are input to an n-bit interleaver 93 and interleaved n-bits by n-bits at a time interval of nTs, which in turn is output to the decoder 7.

Hereinafter, when it is unnecessary to distinguish between the code detector 92-1 and the code detector 92-2, they are generically referred to as the code detectors 92.

As described using FIG. 11, the two code detectors 92 are required to detect a code generated by interleaving. Each of the code detectors 92 is a trellis detector for a dicode channel MSN code with 1−D characteristics. Since the input equalized signal is subjected to code detection while being de-interleaved bit by bit, the code detectors shown in FIG. 11 together construct a detector circuit for a $(1-D)^2$ PR4 channel MSN code.

The code detectors each having the structure described using FIG. 11 are generally used code detectors when TCPR4 modulation is employed. In other words, in the known read/write apparatus described using FIG. 1, the code detector 6 used when TCPR4 modulation is employed has the structure described using FIG. 11. As in the encoder with the structure described using FIG. 10, the details of the code detector 6 are disclosed in, for example, the article by J. W. Rae, et al., IEEE Trans. on Magn., vol. 31, No. 2, pp. 1208–1214, March 1995.

Figure 12:
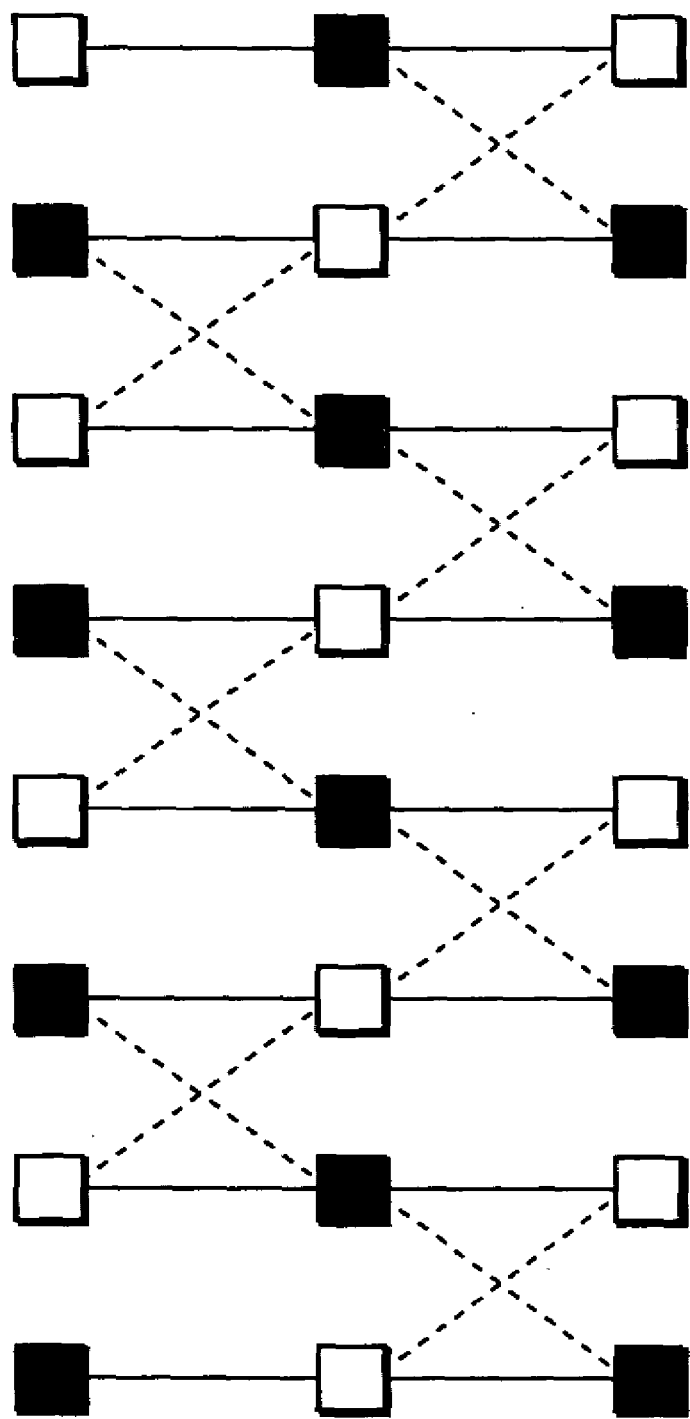
FIG. 12 is a block diagram for describing an 8-state trellis diagram used in the comparative example.

FIG. 12 is an 8-state trellis diagram for two periods of time, which is used by the code detectors 92 shown in FIG. 11.

Referring to FIG. 12, each state colored white or black denotes the positive or negative polarity of a write code after NRZI modulation. For one RDS value, a single state is allocated.

The trellis diagram shown in FIG. 12 takes into consideration a limitation rule of the DSV of the code and inter-symbol-interference for two bits. The minimum squared Euclidean distance is 4, which is similar to a case of the 16-state trellis diagram described using FIG. 6. As in the case described using FIG. 6, the trellis diagram has a basic repeating unit for two periods of time. In the actual apparatus, the trellis diagram is repeatedly used.

In FIG. 12, QCS is not eliminated. In actual use, part of the states of the trellis diagram is eliminated in accordance with the above-described code state transition rule, depending on the detection time. Accordingly, QCS is eliminated.

Figure 13:
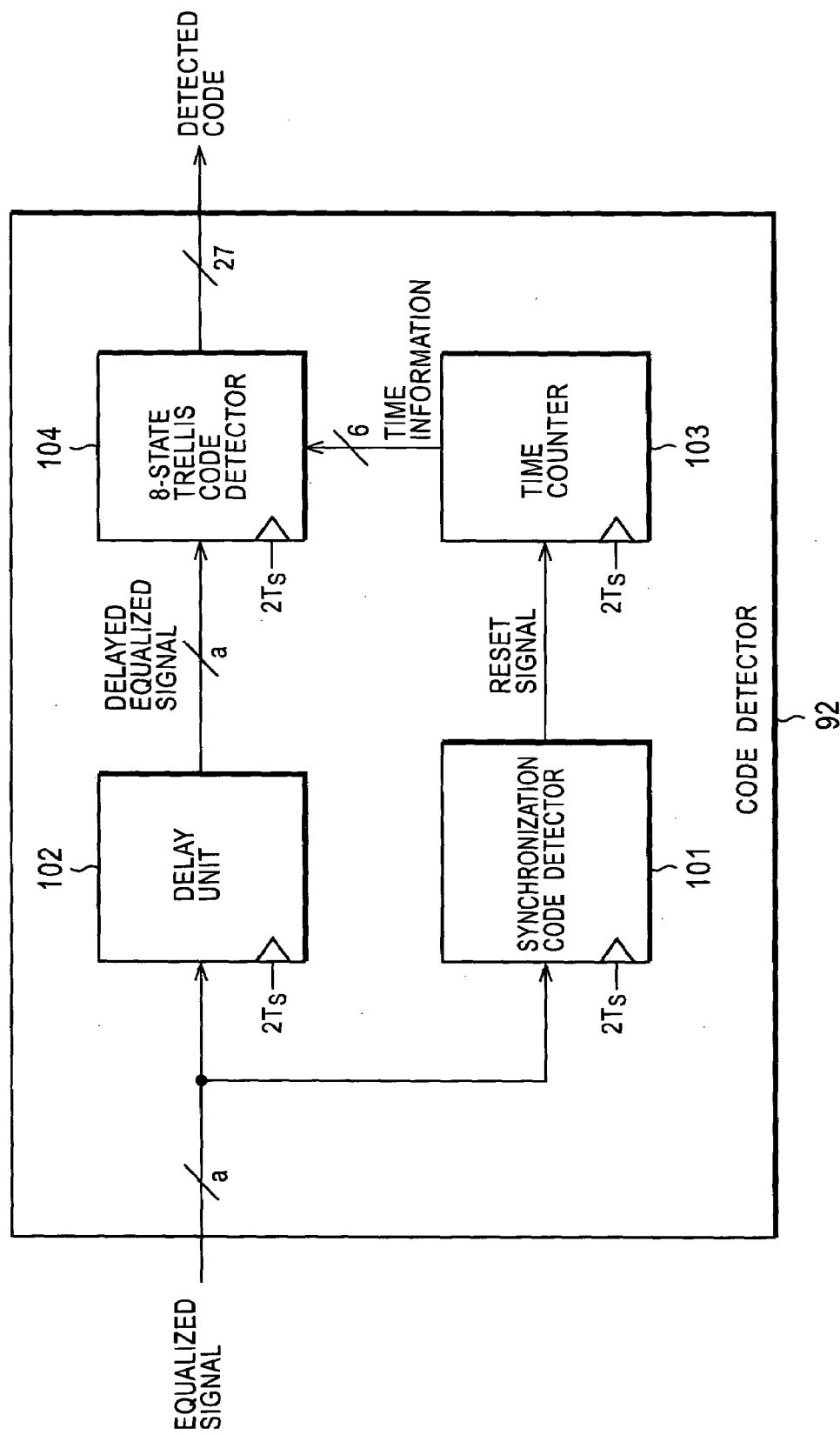
FIG. 13 is a block diagram showing the detailed structure of the code detector shown in FIG. 11.

FIG. 13 is a block diagram showing an example of the detailed structure of each of the code detectors 92 of the code detector described using FIG. 11, which is designed to detect a code when the 8-state trellis diagram described with reference to FIG. 12 is used.

The a-bit quantized equalized signal is input to a synchronization code detector 101 and a delay unit 102. The synchronization code detector 101 performs code detection using a general Viterbi detecting method and outputs to a time counter 103 a 1-bit reset signal indicating whether or not a synchronization code is detected.

The time counter 103 outputs 1 to 54 6-bit time information, which is reset in accordance with the reset signal input from the synchronization code detector 101, to an 8-state trellis code detector 104.

The delay unit 102 receives the a-bit quantized equalized signal input and delays the equalized signal so that the phase of the equalized signal matches that of the reset signal output from the synchronization code detector 101. The delay unit 102 outputs a delayed a-bit quantized equalized signal to the 8-state trellis code detector 104.

Figure 14:
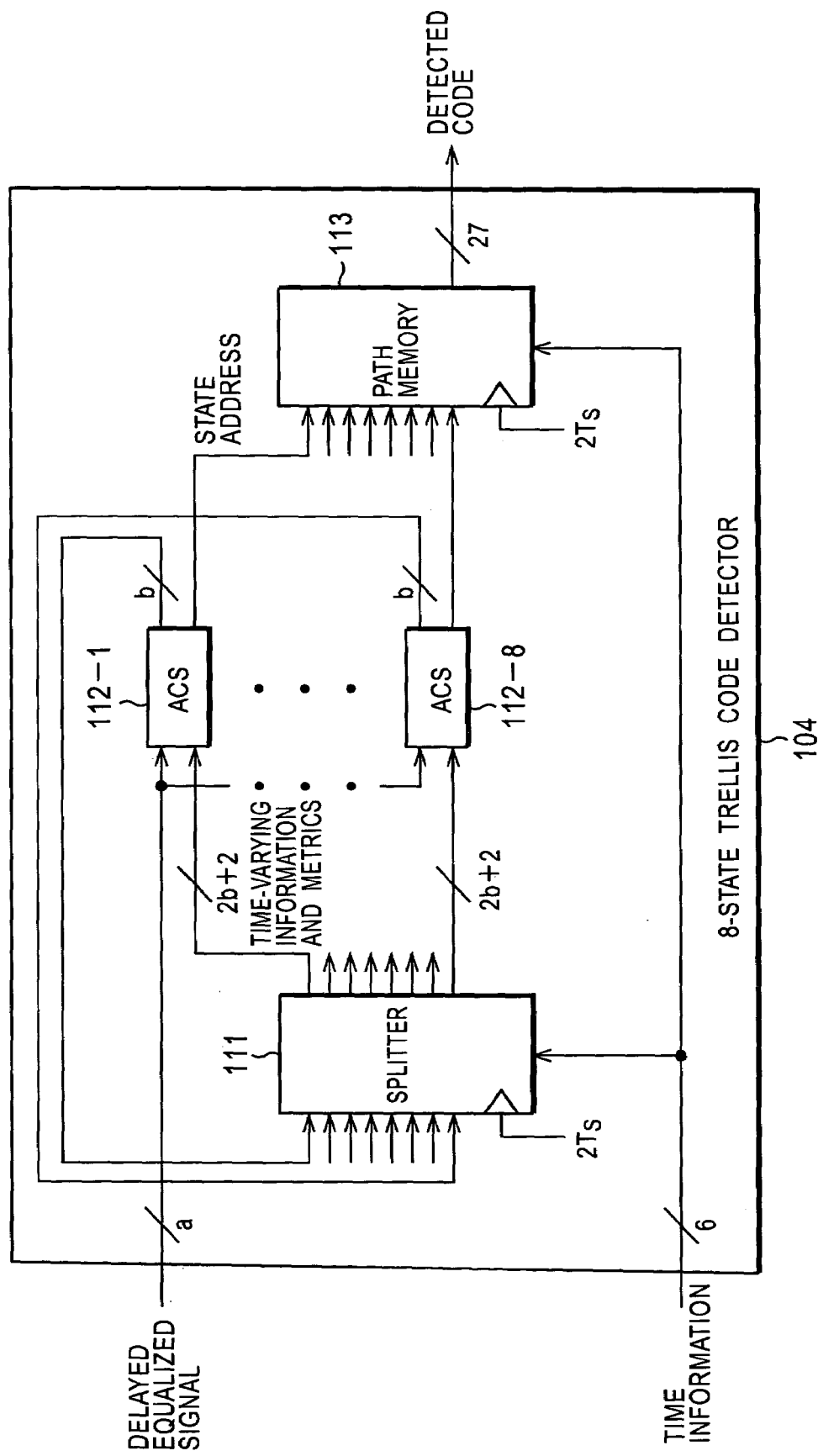
FIG. 14 is a block diagram showing the detailed structure of an 8-state trellis code detector shown in FIG. 13.

The 8-state trellis code detector 104 receives the delayed equalized signal and the time information, performs code detection, and outputs a 27-bit detected code. FIG. 14 is a block diagram showing an example of the detailed structure of the 8-state trellis code detector 104.

The 6-bit time information input from the time counter 103 is input to a splitter 111 and a bus memory 113. The delayed a-bit equalized information input from the delay unit 102 is input to ACS circuits 112-1 to 112-8.

Alternatively, branch metrics for metric calculation are calculated in advance, and the corresponding branch metrics are input to the ACS circuits 112-1 to 112-8.

On the basis of the input time information and the 8-state trellis diagram described using FIG. 12, the splitter 111 generates 8 types of 2-bit time-varying information indicating whether or not each path of two metrics input to each of the ACS circuits 112-1 to 112-8 is broken, selects two appropriate metrics from among 8 previous time metrics that are quantized into b bits for each of the ACS circuits 112-1 to 112-8, and outputs the selected metrics to the ACS circuits 112-1 to 112-8. In other words, the splitter 111 outputs a total of 8×(2b+2)-bit information.

The ACS circuits 112-1 to 112-8 all have the same circuit configuration. By performing the arithmetic processing for addition, comparison, and selection, each of the ACS circuits 112-1 to 112-8 feeds back the current time metric to the splitter 111 and outputs a 1-bit state address indicating a surviving path to the bus memory 113.

The bus memory 113 that has received the input of the 1-bit state addresses selects the correct path on the basis of the address information, the 6-bit time information input from the time counter 103, and the 8-state trellis diagram described using FIG. 12 and outputs a 27-bit detected code with the maximum likelihood.

The performance of the read/write apparatus according to the present invention, which has been described using FIGS. 2 to 8, will now be compared with the performance of the read/write apparatus in the comparative example, which has been described using FIGS. 10 to 14.

Using both of the read/write apparatuses, one megabit random data was encoded. On the corresponding resultant code, the read/write apparatus according to the present invention performed NRZI modulation, which corresponds to the 1/(1−D) processing, and then the 1−$D^2$ PR4 equalization processing. The read/write apparatus in the comparative example performed interleaved NRZI modulation, which corresponds to the 1/(1−$D^2$) processing, and then 1−$D^2$ PR4 equalization processing. In both cases, white noise was added.

The corresponding PR4 equalized signals are subjected to trellis code detection using the code detector 32 according to the present invention, which has been described using FIGS. 4, 7, and 8, and using the code detector described using FIGS. 11, 13, and 14. In both cases, the bit error rate was measured.

Figure 15:
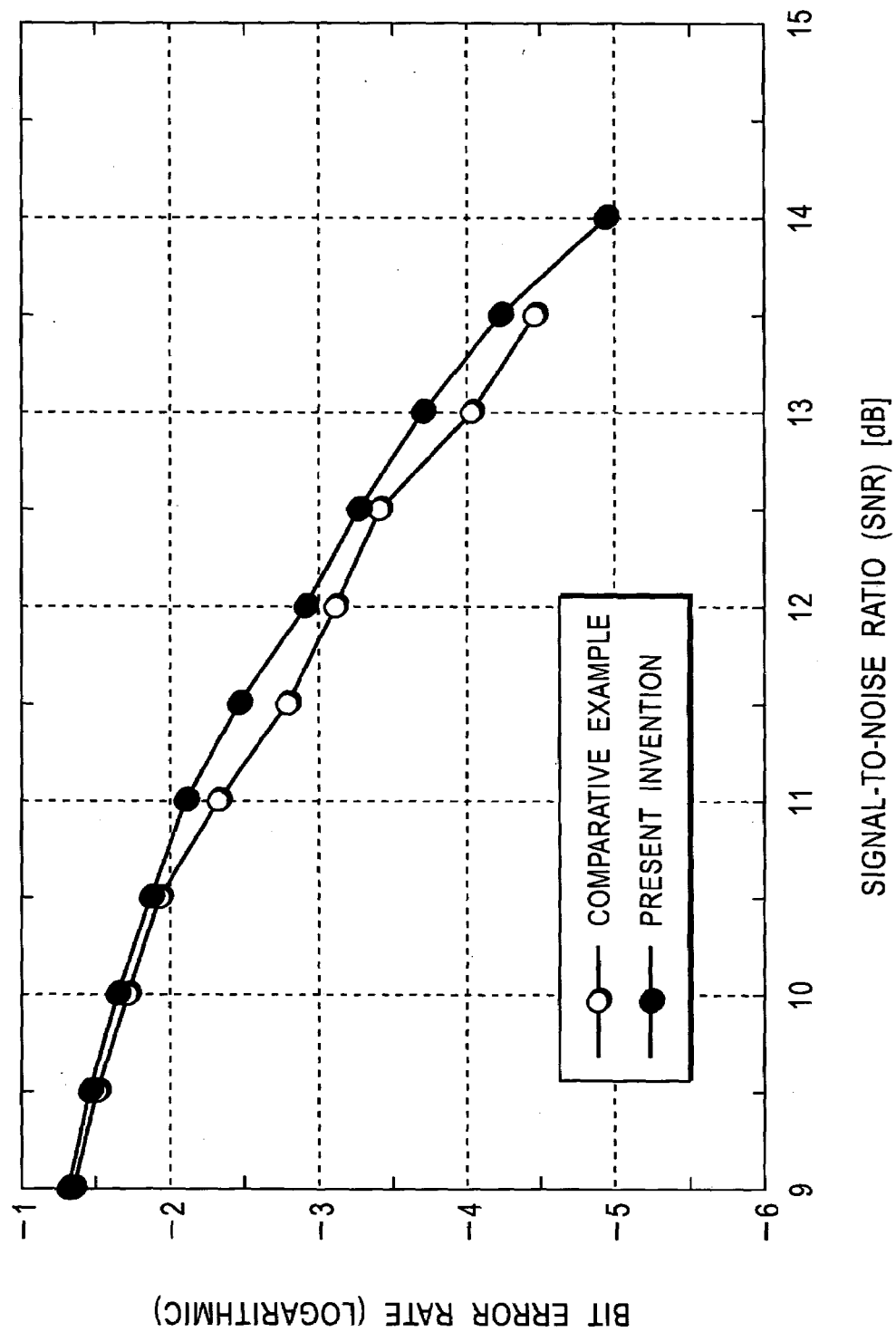
FIG. 15 is a diagram for describing the relationship between the bit error rate and the signal-to-noise ratio of the code detector according to the present invention and the code detector according to the comparative example.

Referring to FIG. 15, the relationship between the signal-to-noise ratio and the bit error rate of each of the read/write apparatus according to the present invention and the read/write apparatus in the comparative example will now be described.

In FIG. 15, the ordinate represents the bit error rate on a logarithmic scale, and the abscissa represents the signal-to-noise ratio. A graph of black points in the diagram represents the measurement result of the read/write apparatus according to the present invention. A graph of white points in the diagram represents the measurement result of the read/write apparatus in the comparative example.

The signal-to-noise ratio according to the present invention is slightly inferior (by approximately 0.1 dB) to that in the comparative example. The reason for this is estimated that, according to the present invention, compared with the comparative example, although the minimum squared Euclidean distance is 4 in both cases, the error rate of the minimum squared Euclidean distance is slightly increased since the number of states is increased from 8 to 16. Since such an increase in the error rate of the code detecting method according to the present invention is very slight, the error rate can be safely considered as approximately equivalent to that in the comparative example. Therefore, there is no problem in actual use.

When the code detecting method according to the present invention is used, compared with the case of a known method that involves interleaving and de-interleaving, Tmax of a trellis code to be used is reduced from 2x to x, that is, reduced to half of that in the known method, with almost no increase in the error rate. In this embodiment, since x=7T, Tmax of a trellis code to be used is reduced from 14T to 7T.

If the number of states of trellis detection is y in the known case, the number of states required in the present invention is 2y, which is twice the number of states in the known case. On the other hand, the number of trellis detectors is reduced from two to one. Therefore, the circuit size required to perform trellis detection in both cases is approximately proportional to 2y, making almost no difference in both cases. In other words, the code detector 32 of the read/write apparatus according to the present invention can be realized with the size almost equivalent to that of the code detector in the comparative example. In this embodiment, since y=8, the number of states is 16 states. The circuit size required to perform trellis detection is equivalent to that in the known case.

In the state transition diagram described using FIG. 5, assuming that NRZI modulation is performed, inversion of all 0's and 1's of a code results in a state transition diagram that imposes a limitation of A-DSV=8. According to the present invention, code detection may be performed using such a code in which A-DSV is limited to a finite number to generate a corresponding trellis diagram.

If either DSV or A-DSV is set to a finite value, the minimum squared Euclidean distance in the trellis diagram for performing code detection of the PR4 equalized signal is 4. Therefore, the code detector achieves an approximately equivalent bit error rate in both cases.

For example, a limitation of A-DSV=10 is imposed, and, as in this embodiment, a 24/27 conversion code is separated into a 12/13 conversion code and a 12/14 conversion code. This results in a PR4 channel trellis code in which Tmax=8T and the maximum number of consecutive ones in NRZI data is 9.

When the present invention is applied to trellis code detection that performs code detection utilizing a coding rule for likelihood calculation, partial response class IV equalization is performed on a read signal, and code detection is performed using a trellis diagram including both a coding rule on a spectral null at one of a DC component and a Nyquist component of a code spectrum and an inter-symbol-interference rule for three bits.

Although a case has been described in which the trellis diagram for use in code detection has twice the number of states as the limitation number of DSV or A-DSV, the number of states can be any value greater than or equal to 2N where N denotes the limitation number.

As a code for use in the present invention, a code whose DSV is limited is preferable to a code whose A-DSV is limited because limiting DSV eliminates a code with a run greater than DSV. Compared with a case in which a code whose A-DSV is limited to the same value as DSV, Tmax of the code is reduced to a smaller value.

In a phase locking method, such as that used in DVC (Digital Video Cassette recorder) systems, that is, a method involving integration detection of a read signal, performing PLL and 1−$D^2$ processing, and reading a PR4 equalized signal, it is similarly preferable to limit the DSV of a code to a finite value in order to achieve high quality of the integral detection signal.

When the maximum number of consecutive zeroes in a read signal is not limited to a finite value, the code detector 32 may generate a QCS, and phase locking may fail in PLL. The circuit operation of PLL may become unstable.

In contrast, when the present invention is applied to a case in which a non-interleaved code is recorded, setting both the maximum number of consecutive zeros and the maximum number of consecutive ones in NRZI data to finite values enables setting the maximum number of consecutive zeroes in a PR4 equalized read signal to a finite value.

Limiting the maximum number of consecutive zeroes in NRZI data is equivalent to limiting Tmax to a finite value. In the above-described 24/27 conversion code in which DSV=8, the maximum number of consecutive ones in NRZI data is limited to 15.

When code interleaving is performed as in the comparative example, limiting the maximum number of consecutive zeroes in non-interleaved NRZI data (prior to interleaving) enables limiting the maximum number of consecutive zeroes in a read signal. It is thus unnecessary to limit the maximum number of consecutive ones in NRZI data.

In the actual circuitry implementation, QCS is generally eliminated from a code in advance in order to prevent degradation of a code detection gain when the memory length of the path memory 73 described using FIG. 8 is limited to a finite value.

In this embodiment, in order to eliminate QCS other than consecutive ones in NRZI data upon code detection, a QCS elimination method disclosed in Japanese Unexamined Patent Application Publication No. 11-186917 and M. Noda, "High-Rate Matched Spectral Null code," IEEE Trans. on Magn., vol. 34, No. 4, pp. 1946–1948, July 1998 is used. However, the method of eliminating QCS in a code for use in the present invention is not limited to the above-described method. Needless to say, QCS in a code can be eliminated using any method.

Another specific method of eliminating QCS in a code is disclosed in, for example, L. Fredrickson, et al., "Improved trellis-coding for partial-response channels," IEEE Trans. on Magn., vol. 31, No. 2, pp. 1141–1148, March 1995.

When the coding rate is low, noise emphasis in the high frequency band is increased by PR4 equalization, which in turn causes degradation of error rate of a read signal. It is thus preferable that the coding rate of a trellis code according to the present invention be set to at least 8/9 as high a value as possible.

As described above, when the trellis code detecting method for the partial response class IV channel according to the present invention is used, the maximum magnetization reversal interval Tmax of a trellis code to be used is reduced to half of that in the case of a known method while having the error rate and the circuit size equivalent to those in the case of the known method. In the actual read/write apparatus, a reduction in the maximum magnetization reversal interval Tmax of a code reduces overwrite noise upon signal reading and writing and stabilizes PLL, which is of very high industrial value.

The above-described series of processes may be executed by software. A program constructing the software is installed from a recording medium into a computer included in dedicated hardware or, for example, a general personal computer capable of performing various functions by installing therein various programs.

Figure 16:
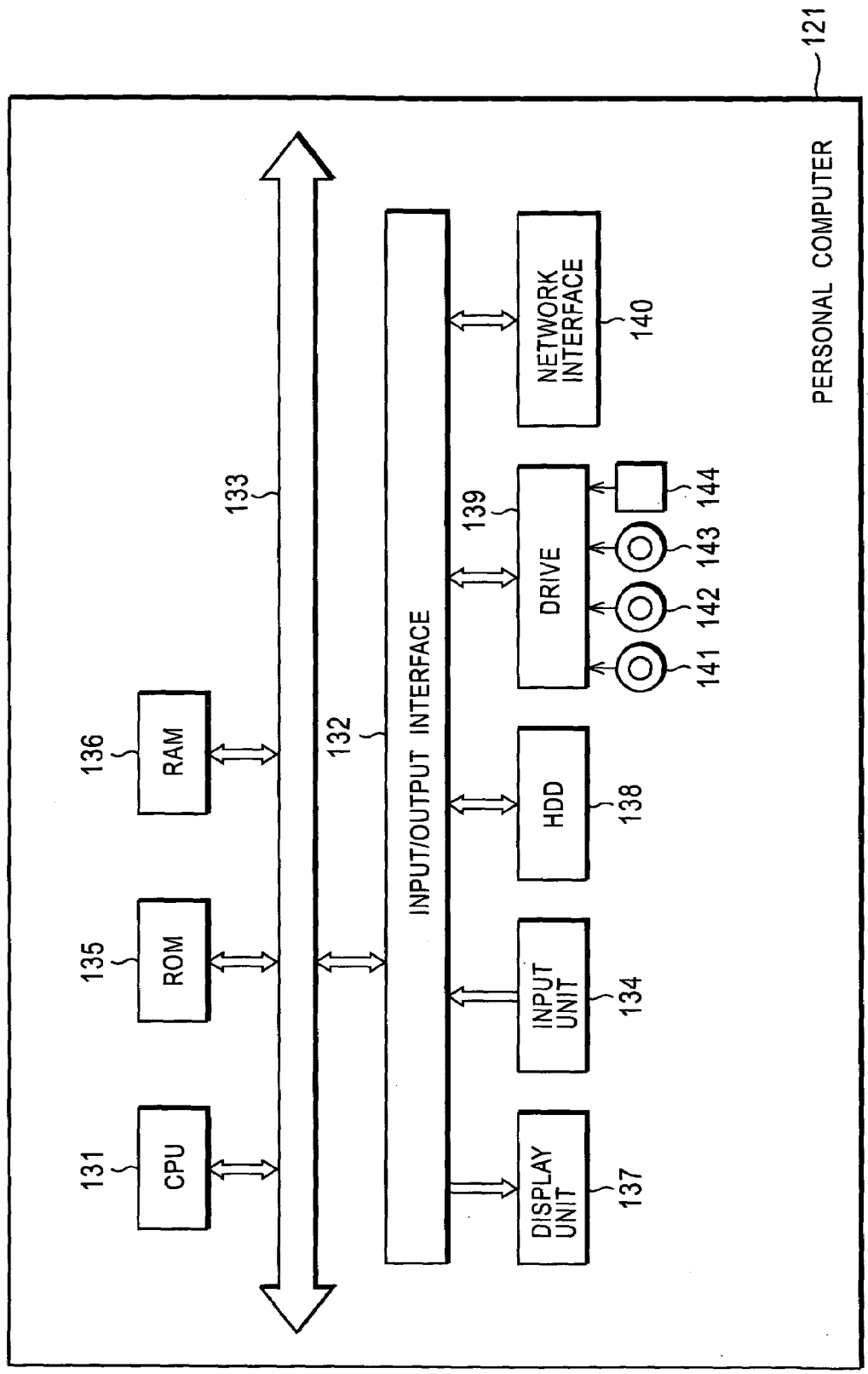
FIG. 16 is a block diagram showing the structure of a personal computer.

The recording medium is formed of, as shown in FIG. 16, packaged media including a magnetic disk 141, an optical disk 142, a magneto-optical disk 143, and/or a semiconductor memory 144, which are distributed to provide users with the program and which have recorded therein the program. The magnetic disk 141 includes a flexible disk. The optical disk 142 includes a CD-ROM (Compact Disk-Read Only Memory) and a DVD (Digital Versatile Disk). The magneto-optical disk 143 includes an MD (Mini-Disk) (trademark).

Using FIG. 16, a personal computer 121 will now be described.

A CPU (Central Processing Unit) 131 receives, via an input/output interface 132 and an internal bus 133, signal inputs corresponding to various instructions input by a user using an input unit 134 and, via a network interface 140, control signal inputs sent from another personal computer and performs various processes based on the input signals. A ROM (Read Only Memory) 135 stores basically fixed data of programs and arithmetic processing parameters used by the CPU 131. A RAM (Random Access Memory) 136 stores programs used upon execution by the CPU 131 and parameters that accordingly change during the execution. The CPU 131, the ROM 135, and the RAM 136 are connected to one another by the internal bus 133.

The internal bus 133 is also connected to the input/output interface 132. The input unit 134 includes, for example, a keyboard, a touch pad, a jog dial, and/or a mouse and is operated by the user to input various instructions to the CPU 131. A display unit 137 includes, for example, a CRT (Cathode Ray Tube) or an LCD (Liquid Crystal Display) and displays various information in the form of text or an image.

An HDD (hard disk drive) 138 drives hard disks to read or write a program to be executed by the CPU 131 or information. In a drive 139, if necessary, the magnetic disk 141, the optical disk 142, the magneto-optical disk 143, and/or the semiconductor disk 144 are placed to exchange data.

The network interface 140 is connected by wire using predetermined cables or wirelessly to another personal computer and/or various apparatuses other than the personal computer to exchange data with these apparatuses. The network interface 140 accesses a web server via the Internet to exchange information.

The input unit 134 to the network interface 140 are connected to the CPU 131 via the input/output interface 132 and the internal bus 133.

In this specification, steps for writing a program recorded in a recording medium not only include time-series processing performed in accordance with the described sequence but also include parallel or individual processing, which may not necessarily be performed in time series.

The code detecting method of the present invention may be combined with a generally known noise whitening method, e.g., a noise predictor.

INDUSTRIAL APPLICABILITY

According to a trellis detector, a trellis code detecting method, and a program of the present invention, a trellis code is detected by applying a coding rule that there is a spectral null at one of a DC component and a Nyquist component of a code spectrum and a partial response class IV inter-symbol-interference rule. While having the error rate and circuit size approximately equal to those in a known case, the maximum magnetization reversal interval Tmax of a trellis code to be used is reduced to half of that in the known case.

According to a decoding apparatus, a decoding method, and a program of the present invention, a trellis code is detected by applying a coding rule that there is a spectral null at one of a DC component and a Nyquist component of a code spectrum and a partial response class IV intersymbol-interference rule, and the detected code is decoded. While having the error rate and circuit size approximately equal to those in a known case, the maximum magnetization reversal interval Tmax of a trellis code to be used is reduced to half of that in the known case. Accordingly, overwrite noise upon signal reading and writing is reduced, and PLL is stabilized.

The invention claimed is:

1. A trellis code detector for performing code detection by using a coding rule for likelihood calculation, comprising:
   means for outputting a digital signal;
   a code detector for performing trellis code detection on the digital signal, wherein the code detector simultaneously applies a plurality of coding rules to detect a code including:
   applying a coding rule on a trellis diagram that there is a spectral null at one of a DC component and a Nyquist component of a code spectrum;
   applying a partial-response class-IV inter-symbol-interference rule; and
   applying an inter-symbol-interference rule for three bits on the trellis diagram.

2. The trellis detector according to claim 1, wherein the code is a combination of codes in which the number of consecutive ones in a signal prior to Non Return to Zero Inverted (NRZI) modulation is limited to a finite value.

3. The trellis detector according to claim 1, wherein the code is a combination of codes with a coding rate of 8/9 or greater.

4. The trellis detector according to claim 1, wherein the code is a non-interleaved code sequence.

5. The trellis detector according to claim 1, wherein, in the code, at least one of a digital sum variation (DSV) of a running digital sum (RDS) and a DSV of an alternating digital sum (ADS) of a code sequence is limited to a predetermined value n (n is an integer greater than or equal to 2), and
   wherein the code detector has 2n or more states and includes ACS circuits, the number of which is the same as the number of states, in order to generate 2n or more transitional states.

6. A trellis code detecting method of performing code detection by using a coding rule for likelihood calculation, comprising:
   performing trellis code detection by simultaneously applying a plurality of code detecting rules to detect a code including:
   applying a coding rule on a trellis diagram that there is a spectral null at one of a DC component and a Nyquist component of a code spectrum;
   applying a partial-response class-IV inter-symbol-interference rule; and
   applying an inter-symbol-interference rule for three bits on the trellis diagram.

7. The trellis detecting method according to claim 6, wherein the code is a combination of codes in which the number of consecutive ones in a signal prior to Non Return to Zero Inverted (NRZI) modulation is limited to a finite value.

8. The trellis detecting method according to claim 6, wherein the code is a combination of codes with a coding rate of 8/9 or greater.

9. The trellis detecting method according to claim 6, wherein the code is a non-interleaved code sequence.

10. The trellis detecting method according to claim 6, wherein, in the code, at least one of a digital sum variation (DSV) of a running digital sum (RDS) and a DSV of an alternating digital sum (ADS) of a code sequence is limited to a predetermined value n (n is an integer greater than or equal to 2), and
    wherein, in order to generate 2n or more transitional states, the code detecting step includes arithmetic steps, the number of which is the same as the number of states.

11. A recording medium having recorded therein a computer-readable program for a trellis code detector for performing code detection by using a coding rule for likelihood calculation, the program comprising:
    computer executable instructions for performing trellis code detection by simultaneously applying a plurality of code detecting rules to detect a code including:
    applying a coding rule on a trellis diagram that there is a spectral null at one of a DC component and a Nyquist component of a code spectrum;
    applying a partial-response class-IV inter-symbol-interference rule; and
    applying an inter-symbol-interference rule for three bits on the trellis diagram.

12. A decoding apparatus for performing code detection by using a coding rule for likelihood calculation, comprising:
    a code detector for performing trellis code detection, wherein the code detector simultaneously applies a plurality of coding rules to detect a code including:
    applying a coding rule on a trellis diagram that there is a spectral null at one of a DC component and a Nyquist component of a code spectrum;
    applying a partial-response class-IV inter-symbol-interference rule;
    applying an inter-symbol-interference rule for three bits on the trellis diagram; and
    a decoder for decoding the code detected by the code detector.

13. A decoding method for a decoding apparatus for performing code detection by using a coding rule for likelihood calculation, comprising:
    performing trellis code detection by simultaneously applying a plurality of code detecting rules to detect a code including:
    applying a coding rule on a trellis diagram that there is a spectral null at one of a DC component and a Nyquist component of a code spectrum;
    applying a partial-response class-IV inter-symbol-interference rule;
    applying an inter-symbol-interference rule for three bits on the trellis diagram; and
    a decoding step of decoding the code detected by the code detector.

14. A recording medium having recorded therein a computer-readable program for a decoding apparatus for performing code detection by using a coding rule for likelihood calculation, the program comprising:
    computer executable instructions for performing trellis code detection by simultaneously applying a plurality of code detecting rules to detect a code including:
    applying a coding rule on a trellis diagram that there is a spectral null at one of a DC component and a Nyquist component of a code spectrum;
    applying a partial-response class-IV inter-symbol-interference rule; and
    applying an inter-symbol-interference rule for three bits on the trellis diagram; and
    a decoding step of decoding the code detected by the code detector.

* * * * *